US012719609B2

(12) United States Patent
Zheng et al.

(10) Patent No.: US 12,719,609 B2
(45) Date of Patent: Aug. 25, 2026

(54) COMMUNICATION METHOD AND APPARATUS

(71) Applicant: HUAWEI TECHNOLOGIES CO., LTD., Shenzhen (CN)

(72) Inventors: Mengfan Zheng, London (GB); Jiaqi Gu, Shenzhen (CN); Cong Ling, London (GB); Mengyao Ma, Shenzhen (CN); Lei Wang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 306 days.

(21) Appl. No.: 18/640,693

(22) Filed: Apr. 19, 2024

(65) Prior Publication Data

US 2024/0267154 A1 Aug. 8, 2024

Related U.S. Application Data

(63) Continuation of application No. PCT/CN2022/120645, filed on Sep. 22, 2022.

(30) Foreign Application Priority Data

Oct. 21, 2021 (CN) ........................ 202111228364.1

(51) Int. Cl.
*H04L 1/00* (2006.01)
*H03M 13/00* (2006.01)
*H03M 13/13* (2006.01)

(52) U.S. Cl.
CPC .......... *H04L 1/0057* (2013.01); *H03M 13/13* (2013.01); *H03M 13/616* (2013.01)

(58) Field of Classification Search
CPC .... H04L 1/0057; H04L 1/0041; H03M 13/13; H03M 13/616; H03M 13/6312
See application file for complete search history.

(56) References Cited

U.S. PATENT DOCUMENTS

2017/0214416 A1* 7/2017 Ge ........................ H03M 13/13

OTHER PUBLICATIONS

Venkatesan Guruswami, Preetum Nakkiran, Algorithmic Polarization for Hidden Markov Models, arXiv:1810.01969v1, Oct. 3, 2018, total 24 pages.

Giuseppe Caire, Shlomo Shamai, Universal Data Compression with LDPC Codes, Princeton University, Princeton NJ, USA, Dec. 2008, total 4 pages.

(Continued)

*Primary Examiner* — Charles C Jiang
*Assistant Examiner* — Shawn D Miller
(74) *Attorney, Agent, or Firm* — HAUPTMAN HAM, LLP

(57) ABSTRACT

A method includes performing source encoding on a first bit sequence thereby obtaining a second bit sequence, obtaining a fourth bit sequence based on the second bit sequence and a third bit sequence, performing channel encoding on the fourth bit sequence thereby obtaining a fifth bit sequence and sending the fifth bit sequence. The fourth bit sequence includes one or more information bits and one or more frozen bits. The first bit location includes E information bit locations and F frozen bit locations. A length of the first bit sequence is A. A is an integer greater than 0. A length of the second bit sequence is B. B is an integer greater than 0. The third bit sequence is C bits in the first bit sequence. C is an integer greater than 0. C is less than or equal to A.

15 Claims, 14 Drawing Sheets

(56) References Cited

OTHER PUBLICATIONS

Eren Sa so glu and Ido Tal, Polar Coding for Processes With Memory, IEEE Transactions on Information Theory, vol. 65, No. 4, Apr. 2019, total 10 pages.
Colin Boyd, John G. Cleary, Integrating Error Detection into Arithmetic Coding, IEEE Transactions on Communications, vol. 45, No. 1, Jan. 1997, total 3 pages.
Ying Wang, Minghai Qin, Joint Source-Channel Decoding of Polar Codes for Language-Based Source, arXiv:1601.06184v1, Jan. 22, 2016, total 20 pages.
Ying Wang, Krishna R. Narayanan, Exploiting Source Redundancy to Improve the Rate of Polar Codes, 2017 IEEE International Symposium on Information Theory (ISIT), Jun. 25-30, 2017, total 5 pages.

* cited by examiner 1 50 51 130 131 170

First bit sequence ...

Source encoding 1 30 60 90

Second bit sequence ...

COMMUNICATION METHOD AND APPARATUS

CROSS-REFERENCE TO RELATED APPLICATIONS

This application is a continuation of International t Application No. PCT/CN2022/120645, filed on Sep. 22, 2022, which claims priority to Chinese Patent Application No. 202111228364.1, filed on Oct. 21, 2021, the disclosures of the aforementioned applications are hereby incorporated by reference in their entireties.

TECHNICAL FIELD

This application relates to the communication field, and in particular, to a communication method and apparatus.

BACKGROUND

Separate source channel coding (SSCC) means performing source coding and channel coding separately, and has advantages of a simple design and good universality and has a disadvantage of being unable to accurately determine an incorrect decoding result without fully utilizing respective advantages. This reduces system performance.

SUMMARY

One or more embodiments of the present application provide a communication method and apparatus, so that an incorrect decoding result can be accurately determined, and a probability of detecting the incorrect decoding result can be increased, thereby improving system performance.

To achieve the foregoing objectives, One or more embodiments of the present application uses the following technical solutions.

According to a first aspect, a communication method is provided. The communication method includes: performing source encoding on a first bit sequence to obtain a second bit sequence; obtaining a fourth bit sequence based on the second bit sequence and a third bit sequence; performing channel encoding on the fourth bit sequence to obtain a fifth bit sequence; and sending the fifth bit sequence. A length of the first bit sequence is A, A is an integer greater than 0, a length of the second bit sequence is B, and B is an integer greater than 0. The third bit sequence is C bits in the first bit sequence, C is an integer greater than 0 and less than or equal to A, a length of the fourth bit sequence is N, N is an integer greater than 0, the fourth bit sequence includes one or more information bits and one or more frozen bits, the second bit sequence is located on B information bit locations in the fourth bit sequence, the third bit sequence is located on a first bit location in the fourth bit sequence, the first bit location includes E information bit locations and F frozen bit locations, E+F=C, E is an integer greater than or equal to 0, and F is an integer greater than or equal to 0. A length of the fifth bit sequence is N, and N is an integer greater than 0.

Based on the communication method shown in the first aspect, a transmit end combines a source encoding result of the first bit sequence with some bit sequences in the first bit sequence to obtain a channel encoding input, namely, the fourth bit sequence, and performs channel encoding on the fourth bit sequence. In a process of decoding a to-be-decoded sequence, a receive end may perform joint decoding by using some bit sequences in the first bit sequence. An incorrect decoding result can be accurately determined by using a joint source and channel coding (JSCC) scheme, and a probability of detecting the incorrect decoding result can be increased, thereby improving system performance.

In some embodiments, E is equal to C and F is equal to 0, the first bit location meets a first principle, and the first principle may include: The first bit location is located on the E information bit locations whose natural orders rank top in the fourth bit sequence. In this way, in the decoding process, the receive end can determine earlier whether the decoding result is accurate, and can stop decoding earlier if an error occurs in the decoding result.

In some embodiments, F is equal to C and E is equal to 0, the first bit location meets a second principle, and the second principle may include: The first bit location in the fourth bit sequence corresponds to a first location in the to-be-decoded sequence, where after source decoding is performed on a result obtained by performing channel decoding on a value before the first location in the to-be-decoded sequence, source decoding values of one or more bits in the third bit sequence can be obtained; or the first bit location is located on the F frozen bit locations whose natural orders rank low in the fourth bit sequence. In this way, in the decoding process, if an error occurs in a channel decoding value of the second bit sequence, errors of a current decoding path are accumulated. Therefore, the decoding errors are easily identified, and a decoding success rate can be increased.

In some embodiments, that the third bit sequence is C bits in the first bit sequence may include: The third bit sequence is C bits whose natural orders rank top in the first bit sequence. In this way, the bits whose natural orders rank top in the first bit sequence are used as the third bit sequence, so that the bits can be checked earlier in the decoding process. Whether the decoding result is accurate can be determined earlier, and if the error occurs in the decoding result, decoding can be stopped earlier, thereby improving the system performance.

In some embodiments, that the third bit sequence is located on a first bit location in the fourth bit sequence may include: Scrambled third bit sequence is located on the first bit location in the fourth bit sequence; and the scrambled third bit sequence is obtained based on a scrambling sequence and the third bit sequence. In this way, scrambling the information bit in the fourth bit sequence does not increase a channel encoding bit rate, and the system performance can be improved.

According to a second aspect, a communication method is provided. The communication method includes: receiving a to-be-decoded sequence; performing channel decoding on the to-be-decoded sequence to obtain a channel decoding value of a fourth bit sequence; and performing source decoding on a channel decoding value of a second bit sequence to obtain a source decoding value of a first bit sequence.

A length of the to-be-decoded sequence is N, N is an integer greater than 0, the to-be-decoded sequence is a sequence obtained after a fifth bit sequence is transmitted through a channel, the fifth bit sequence is a channel encoding value of the fourth bit sequence, a first location in the to-be-decoded sequence corresponds to a first bit location in the fourth bit sequence, a third bit sequence is located on the first bit location in the fourth bit sequence, the first bit location in the fourth bit sequence includes E information bit locations and F frozen bit locations, E+F=C, E is an integer greater than or equal to 0, F is an integer greater than or equal to 0, the third bit sequence is C bits in the first bit sequence, a length of the first bit sequence is A, A is an integer greater than 0, and C is an integer greater than 0 and less than or equal to A. A second location in the to-be-decoded sequence corresponds to B information bit locations occupied by the second bit sequence in the fourth bit sequence, the second bit sequence is a source encoding value of the first bit sequence, a length of the second bit sequence is B, and B is an integer greater than 0. The channel decoding value of the fourth bit sequence includes a channel decoding value of the second bit sequence and a channel decoding value of the third bit sequence, and a length of the fourth bit sequence is N.

In some embodiments, E is equal to C and F is equal to 0, the first bit location in the fourth bit sequence meets a first principle, and the first principle may include: The first bit location is located on the E information bit locations whose natural orders rank top in the fourth bit sequence.

In some embodiments, the performing channel decoding on the to-be-decoded sequence to obtain a channel decoding value of a fourth bit sequence may include: A channel decoding mode is a successive cancellation list (SCL) decoding mode, a quantity of lists is L, L is an integer greater than 0, an initial value of $c_{u\_total}$ is equal to 0, and if $c_{u\_total}$ is less than C, a following first source channel operation is performed:

- performing channel decoding on values of an (n-m)th bit to an $n^{th}$ bit in the to-be-decoded sequence to obtain a first decoding result, where the (n-m)th bit to the $n^{th}$ bit may include at least one location in the first location and/or b locations in the second location, n-m is an integer greater than 0, m is an integer greater than 0, the first decoding result may include channel decoding values of b bits in the second bit sequence and/or a channel decoding value of at least one bit in the third bit sequence, and b is an integer greater than 0 and less than or equal to B;
- performing source decoding on the channel decoding values corresponding to the b bits in the second bit sequence to obtain source decoding values of $c_t$ bits in the third bit sequence, where $c_t$ is an integer greater than 0 and less than or equal to C; and
- determining, based on source decoding values of $c_u$ bits in the third bit sequence and channel decoding values of $c_u$ bits corresponding to a natural order of the third bit sequence, to continue to perform, based on l decoding paths, the first source channel operation on values of an $(n+1)^{th}$ bit to an $N^{th}$ bit in the to-be-decoded sequence, and counting $c_u$ in $c_{u\_total}$, where $c_u$ is an integer greater than 0, and l is an integer less than or equal to L; or
- if $c_{u\_total}$ is equal to C and n is less than N, continuing to perform channel decoding on the values of the $(n+1)^{th}$ bit to the $N^{th}$ bit in the to-be-decoded sequence.

In some embodiments, the determining, based on source decoding values of $c_u$ bits in the third bit sequence and channel decoding values of $c_u$ bits corresponding to a natural order of the third bit sequence, to continue to perform, based on l decoding paths, the first source channel operation on values of an $(n+1)^{th}$ bit to an $N^{th}$ bit in the to-be-decoded sequence, and counting $c_u$ in $c_{u\_total}$ may include: traversing the l decoding paths, determining whether the source decoding values that correspond to a first decoding path and that are of the $c_u$ bits in the third bit sequence are the same as the channel decoding values that correspond to the first decoding path and that are of the $c_u$ bits corresponding to the natural order of the third bit sequence, and counting $c_u$ in $c_{u\_total}$, where the first decoding path is one of the l decoding paths; and if they are different, determining to delete the first decoding path, and terminating the first source channel operation that is based on the first decoding path; or if they are the same, determining that the l decoding paths include the first decoding path.

In some embodiments, F is equal to C and E is equal to 0, the first bit location meets a second principle, and the second principle includes: The first bit location in the fourth bit sequence corresponds to the first location in the to-be-decoded sequence, where after source decoding is performed on a result obtained by performing channel decoding on a value before the first location in the to-be-decoded sequence, source decoding values of one or more bits in the third bit sequence can be obtained; or the first bit location is located on the F frozen bit locations whose natural orders rank low in the fourth bit sequence.

In some embodiments, the performing channel decoding on the to-be-decoded sequence to obtain a channel decoding value of a fourth bit sequence includes: A channel decoding mode is a successive cancellation list SCL decoding mode, a quantity of lists is L, L is an integer greater than 0, an initial value of $c_{t\_total}$ is equal to 0, and if $c_{t\_total}$ is less than C, a following second source channel operation is performed:

- performing channel decoding on values of an $(n-m)^{th}$ bit to an $n^{th}$ bit in the to-be-decoded sequence to obtain a second decoding result, where an $(n+1)^{th}$ bit is one location in the first location, n−m is an integer greater than 0, m is an integer greater than 0, and the second decoding result includes channel decoding values of b bits in the second bit sequence;
- performing source decoding on the channel decoding values of the b bits in the second bit sequence to obtain source decoding values of $c_t$ bits in the third bit sequence, and counting $c_t$ in $c_{t\_total}$, where $c_t$ is an integer greater than 0 and less than or equal to C, and the source decoding values of the $c_t$ bits in the third bit sequence are successively used as channel decoding values at $c_t$ locations in the first location in the to-be-decoded sequence; and
- if $c_{t\_total}$ is greater than 0 and less than C, continuing to perform the second source channel operation on values of the $(n+1)^{th}$ bit to an $N^{th}$ bit in the to-be-decoded sequence; or
- if $c_{t\_total}$ is equal to C and n is less than N, continuing to perform channel decoding on values of the $(n+1)^{th}$ bit to an $N^{th}$ bit in the to-be-decoded sequence.

In some embodiments, that the third bit sequence is C bits in the first bit sequence may include: The third bit sequence is C bits whose natural orders rank top in the first bit sequence.

In addition, for technical effect of the communication method according to the second aspect, refer to technical effect of the communication method according to the first aspect. Details are not described herein again.

According to a third aspect, a communication method is provided. The communication method includes: receiving a to-be-decoded sequence; performing iterative channel decoding for a $q^{th}$ time on the to-be-decoded sequence to obtain a channel decoding value of a fourth bit sequence; performing source decoding for a $g^{th}$ time on a channel decoding value of a second bit sequence to obtain a source decoding value of a first bit sequence; and when a channel decoding value of a third bit sequence is the same as a source decoding value of the third bit sequence, or q is equal to Q, outputting the source decoding value of the first bit sequence. q is an integer greater than 0, and the channel decoding value of the fourth bit sequence includes the channel decoding value of the second bit sequence and the channel decoding value of the third bit sequence. Q is a maximum quantity of iterations, and Q is an integer greater than 0.

The to-be-decoded sequence is a sequence obtained after a fifth bit sequence is transmitted through a channel, the fifth bit sequence is a channel encoding value of the fourth bit sequence, a first location in the to-be-decoded sequence corresponds to a first bit location in the fourth bit sequence, the third bit sequence is located on the first bit location in the fourth bit sequence, the first bit location in the fourth bit sequence includes C information bit locations, the third bit sequence is C bits in the first bit sequence, a length of the first bit sequence is A, A is an integer greater than 0, and C is an integer greater than 0 and less than or equal to A. A second location in the to-be-decoded sequence corresponds to B information bit locations occupied by the second bit sequence in the fourth bit sequence, the second bit sequence is a source encoding value of the first bit sequence, a length of the second bit sequence is B, and B is an integer greater than 0.

In some embodiments, the communication method according to the third aspect may further include: when the channel decoding value of the third bit sequence is different from the source decoding value of the third bit sequence, and q is less than Q, performing iterative channel decoding for a $(q+s)^{th}$ time on the to-be-decoded sequence, and performing source decoding for a $(g+t)^{th}$ time on the channel decoding value that is in a result obtained by performing iterative channel decoding for a $(q+s)^{th}$ time and that is of the second bit sequence. s is an integer greater than 0, and t is an integer greater than 0.

In some embodiments, the performing source decoding for a $g^{th}$ time on a channel decoding value of a second bit sequence to obtain a source decoding value of a first bit sequence may include: when the channel decoding value of the fourth bit sequence passes a channel check, performing source decoding for a $g^{th}$ time on the channel decoding value of the second bit sequence to obtain the source decoding value of the first bit sequence.

In addition, for technical effect of the communication method according to the third aspect, refer to technical effect of the communication method according to the first aspect. Details are not described herein again.

According to a fourth aspect, a communication apparatus is provided. The communication apparatus includes a processing module and a transceiver module.

The processing module is configured to perform source encoding on a first bit sequence to obtain a second bit sequence. A length of the first bit sequence is A, A is an integer greater than 0, a length of the second bit sequence is B, and B is an integer greater than 0.

The processing module is further configured to obtain a fourth bit sequence based on the second bit sequence and a third bit sequence. The third bit sequence is C bits in the first bit sequence, C is an integer greater than 0 and less than or equal to A, a length of the fourth bit sequence is N, N is an integer greater than 0, the fourth bit sequence includes one or more information bits and one or more frozen bits, the second bit sequence is located on B information bit locations in the fourth bit sequence, the third bit sequence is located on a first bit location in the fourth bit sequence, the first bit location includes E information bit locations and F frozen bit locations, E+F=C, E is an integer greater than or equal to 0, and F is an integer greater than or equal to 0.

The processing module is further configured to perform channel encoding on the fourth bit sequence to obtain a fifth bit sequence. A length of the fifth bit sequence is N, and N is an integer greater than 0.

The transceiver module is configured to send the fifth bit sequence.

In some embodiments, E is equal to C and F is equal to 0, the first bit location meets a first principle, and the first principle may include: The first bit location is located on the E information bit locations whose natural orders rank top in the fourth bit sequence.

In some embodiments, F is equal to C and E is equal to 0, the first bit location meets a second principle, and the second principle may include: The first bit location in the fourth bit sequence corresponds to a first location in the to-be-decoded sequence, where after source decoding is performed on a result obtained by performing channel decoding on a value before the first location in the to-be-decoded sequence, source decoding values of one or more bits in the third bit sequence can be obtained; or the first bit location is located on the F frozen bit locations whose natural orders rank low in the fourth bit sequence.

In some embodiments, that the third bit sequence is C bits in the first bit sequence may include: The third bit sequence is C bits whose natural orders rank top in the first bit sequence.

In some embodiments, that the third bit sequence is located on a first bit location in the fourth bit sequence may include: Scrambled third bit sequence is located on the first bit location in the fourth bit sequence; and the scrambled third bit sequence is obtained based on a scrambling sequence and the third bit sequence.

It should be noted that the transceiver module according to the fourth aspect may include a receiving module and a sending module. The receiving module is configured to receive data and/or signaling from a receive end, and the sending module is configured to send data and/or signaling to the receive end. A specific implementation of the transceiver module is not limited in this application.

In some embodiments, the communication apparatus according to the fourth aspect may further include a storage module. The storage module stores a program or instructions. When the processing module executes the program or the instructions, the communication apparatus according to the fourth aspect may be enabled to perform the method according to the first aspect.

It should be noted that the communication apparatus according to the fourth aspect may be a transmit end (for example, a network device or a terminal device), or may be a chip (system) or another component or assembly disposed in the transmit end. This is not limited in this application.

In addition, for technical effect of the communication apparatus according to the fourth aspect, refer to technical effect of the communication method in any possible implementation of the first aspect. Details are not described herein again.

According to a fifth aspect, a communication apparatus is provided. The communication apparatus includes a processing module and a transceiver module.

The transceiver module is configured to receive a to-be-decoded sequence. A length of the to-be-decoded sequence is N, N is an integer greater than 0, the to-be-decoded sequence is a sequence obtained after a fifth bit sequence is transmitted through a channel, the fifth bit sequence is a channel encoding value of a fourth bit sequence, a first location in the to-be-decoded sequence corresponds to a first bit location in the fourth bit sequence, a third bit sequence is located on the first bit location in the fourth bit sequence, the first bit location in the fourth bit sequence includes E information bit locations and F frozen bit locations, E+F=C, E is an integer greater than or equal to 0, F is an integer greater than or equal to 0, the third bit sequence is C bits in a first bit sequence, a length of the first bit sequence is A, A is an integer greater than 0, and C is an integer greater than 0 and less than or equal to A. A second location in the to-be-decoded sequence corresponds to B information bit locations occupied by a second bit sequence in the fourth bit sequence, the second bit sequence is a source encoding value of the first bit sequence, a length of the second bit sequence is B, and B is an integer greater than 0.

The processing module is configured to perform channel decoding on the to-be-decoded sequence to obtain a channel decoding value of the fourth bit sequence. The channel decoding value of the fourth bit sequence includes a channel decoding value of the second bit sequence and a channel decoding value of the third bit sequence, and a length of the fourth bit sequence is N.

The processing module is further configured to perform source decoding on the channel decoding value of the second bit sequence to obtain a source decoding value of the first bit sequence.

In some embodiments, E is equal to C and F is equal to 0, the first bit location in the fourth bit sequence meets a first principle, and the first principle may include: The first bit location is located on the E information bit locations whose natural orders rank top in the fourth bit sequence.

In some embodiments, a channel decoding mode is a successive cancellation list SCL decoding mode, a quantity of lists is L, Lis an integer greater than 0, an initial value of $c_{u\_total}$ is equal to 0, and if $c_{u\_total}$ is less than C, the processing module is further configured to perform a following first source channel operation:

The processing module is further configured to perform channel decoding on values of an $(n-m)^{th}$ bit to an $n^{th}$ bit in the to-be-decoded sequence to obtain a first decoding result, where the $(n-m)^{th}$ bit to the $n^{th}$ bit may include at least one location in the first location and/or b locations in the second location, n−m is an integer greater than 0, m is an integer greater than 0, the first decoding result may include channel decoding values of b bits in the second bit sequence and/or a channel decoding value of at least one bit in the third bit sequence, and b is an integer greater than 0 and less than or equal to B;

- the processing module is further configured to perform source decoding on the channel decoding values corresponding to the b bits in the second bit sequence to obtain source decoding values of $c_t$ bits in the third bit sequence, where $c_t$ is an integer greater than 0 and less than or equal to C; and
- the processing module is further configured to: determine, based on source decoding values of $c_u$ bits in the third bit sequence and channel decoding values of $c_u$ bits corresponding to a natural order of the third bit sequence, to continue to perform, based on l decoding paths, the first source channel operation on values of an $(n+1)^{th}$ bit to an $N^{th}$ bit in the to-be-decoded sequence, and count $c_u$ in $c_{u\_total}$, where $c_u$ is an integer greater than 0, and l is an integer less than or equal to L; or
- if $c_{u\_total}$ is equal to C and n is less than N, the processing module is further configured to continue to perform channel decoding on the values of the $(n+1)^{th}$ bit to the $N^{th}$ bit in the to-be-decoded sequence.

In some embodiments, the processing module is further configured to: traverse the l decoding paths, determine whether the source decoding values that correspond to a first decoding path and that are of the $c_u$ bits in the third bit sequence are the same as the channel decoding values that correspond to the first decoding path and that are of the $c_u$ bits corresponding to the natural order of the third bit sequence, and count $c_u$ in $c_{u\_total}$. The first decoding path is one of the l decoding paths.

If they are different, the processing module is further configured to: determine to delete the first decoding path, and terminate the first source channel operation that is based on the first decoding path.

If they are the same, the processing module is further configured to determine that the l decoding paths include the first decoding path.

In some embodiments, F is equal to C and E is equal to 0, the first bit location meets a second principle, and the second principle includes: The first bit location in the fourth bit sequence corresponds to the first location in the to-be-decoded sequence, where after source decoding is performed on a result obtained by performing channel decoding on a value before the first location in the to-be-decoded sequence, source decoding values of one or more bits in the third bit sequence can be obtained; or the first bit location is located on the F frozen bit locations whose natural orders rank low in the fourth bit sequence.

In some embodiments, a channel decoding mode is a successive cancellation list SCL decoding mode, a quantity of lists is L, Lis an integer greater than 0, an initial value of $c_t$ total is equal to 0, and if $c_t$ total is less than C, the processing module is further configured to perform a following second source channel operation:

The processing module is further configured to perform channel decoding on values of an $(n-m)^{th}$ bit to an $n^{th}$ bit in the to-be-decoded sequence to obtain a second decoding result, where an $(n+1)^{th}$ bit is one location in the first location, n−m is an integer greater than 0, m is an integer greater than 0, and the second decoding result includes channel decoding values of b bits in the second bit sequence;

- the processing module is further configured to: perform source decoding on the channel decoding values of the b bits in the second bit sequence to obtain source decoding values of $c_t$ bits in the third bit sequence, and count $c_t$ in $c_{t\_total}$, where $c_t$ is an integer greater than 0 and less than or equal to C, and the source decoding values of the $c_t$ bits in the third bit sequence are successively used as channel decoding values at $c_t$ locations in the first location in the to-be-decoded sequence; and
- if $c_{t\_total}$ is greater than 0 and less than C, the processing module is further configured to continue to perform the second source channel operation on values of the $(n+1)^{th}$ bit to an $N^{th}$ bit in the to-be-decoded sequence; or
- if $c_{t\_total}$ is equal to C and n is less than N, the processing module is further configured to continue to perform channel decoding on values of the $(n+1)^{th}$ bit to an $N^{th}$ bit in the to-be-decoded sequence.

In some embodiments, that the third bit sequence is C bits in a first bit sequence may include: The third bit sequence is C bits whose natural orders rank top in the first bit sequence.

It should be noted that the transceiver module according to the fifth aspect may include a receiving module and a sending module. The receiving module is configured to receive data and/or signaling from a transmit end, and the sending module is configured to send data and/or signaling to the transmit end. A specific implementation of the transceiver module is not limited in this application.

In some embodiments, the communication apparatus according to the fifth aspect may further include a storage module. The storage module stores a program or instructions. When the processing module executes the program or the instructions, the communication apparatus according to the fifth aspect may be enabled to perform the method according to the second aspect.

It should be noted that the communication apparatus according to the fifth aspect may be a receive end (for example, a network device or a terminal device), or may be a chip (system) or another component or assembly disposed in the receive end. This is not limited in this application.

In addition, for technical effect of the communication apparatus according to the fifth aspect, refer to technical effect of the communication method in any possible implementation of the second aspect. Details are not described herein again.

According to a sixth aspect, a communication apparatus is provided. The communication apparatus includes a processing module and a transceiver module.

The transceiver module is configured to receive a to-be-decoded sequence. The to-be-decoded sequence is a sequence obtained after a fifth bit sequence is transmitted through a channel, the fifth bit sequence is a channel encoding value of a fourth bit sequence, a first location in the to-be-decoded sequence corresponds to a first bit location in the fourth bit sequence, a third bit sequence is located on the first bit location in the fourth bit sequence, the first bit location in the fourth bit sequence includes C information bit locations, the third bit sequence is C bits in a first bit sequence, a length of the first bit sequence is A, A is an integer greater than 0, and C is an integer greater than 0 and less than or equal to A. A second location in the to-be-decoded sequence corresponds to B information bit locations occupied by a second bit sequence in the fourth bit sequence, the second bit sequence is a source encoding value of the first bit sequence, a length of the second bit sequence is B, and B is an integer greater than 0.

The processing module is configured to perform iterative channel decoding for a $q^{th}$ time on the to-be-decoded sequence to obtain a channel decoding value of the fourth bit sequence. q is an integer greater than 0, and the channel decoding value of the fourth bit sequence includes a channel decoding value of the second bit sequence and a channel decoding value of the third bit sequence.

The processing module is further configured to perform source decoding for a $g^{th}$ time on the channel decoding value of the second bit sequence to obtain a source decoding value of the first bit sequence. g is an integer greater than 0, and the source decoding value of the first bit sequence includes a source decoding value of the third bit sequence.

The processing module is further configured to: when the channel decoding value of the third bit sequence is the same as the source decoding value of the third bit sequence, or q is equal to Q, output the source decoding value of the first bit sequence. Q is a maximum quantity of iterations, and Q is an integer greater than 0.

In some embodiments, the processing module is further configured to: when the channel decoding value of the third bit sequence is different from the source decoding value of the third bit sequence, and q is less than Q, perform iterative channel decoding for a $(q+s)^{th}$ time on the to-be-decoded sequence, and perform source decoding for a $(g+t)^{th}$ time on the channel decoding value that is in a result obtained by performing iterative channel decoding for a $(q+s)^{th}$ time and that is of the second bit sequence. s is an integer greater than 0, and t is an integer greater than 0.

In some embodiments, the processing module is further configured to: when the channel decoding value of the fourth bit sequence passes a channel check, perform source decoding for a $g^{th}$ time on the channel decoding value of the second bit sequence to obtain the source decoding value of the first bit sequence.

It should be noted that the transceiver module according to the sixth aspect may include a receiving module and a sending module. The receiving module is configured to receive data and/or signaling from a transmit end, and the sending module is configured to send data and/or signaling to the transmit end. A specific implementation of the transceiver module is not limited in this application.

In some embodiments, the communication apparatus according to the sixth aspect may further include a storage module. The storage module stores a program or instructions. When the processing module executes the program or the instructions, the communication apparatus according to the sixth aspect may be enabled to perform the method according to the third aspect.

It should be noted that the communication apparatus according to the sixth aspect may be a receive end (for example, a network device or a terminal device), or may be a chip (system) or another component or assembly disposed in the receive end. This is not limited in this application.

In addition, for technical effect of the communication apparatus according to the sixth aspect, refer to technical effect of the communication method in any possible implementation of the third aspect. Details are not described herein again.

According to a seventh aspect, a communication apparatus is provided. The communication apparatus includes a processor. The processor is coupled to a memory, and the memory is configured to store a computer program.

The processor is configured to execute the computer program stored in the memory, and the communication method in any possible implementation of the first aspect to the third aspect is enabled to be performed.

In some embodiments, the communication apparatus according to the seventh aspect may further include a transceiver. The transceiver may be a transceiver circuit or an input/output port. The transceiver may be used by the communication apparatus to communicate with another device.

It should be noted that the input port may be configured to implement the receiving functions in the first aspect to the third aspect, and the output port may be configured to implement the sending functions in the first aspect to the third aspect.

In this application, the communication apparatus according to the seventh aspect may be a transmit end, a receive end, or a chip or a chip system disposed in the transmit end or the receive end.

In addition, for technical effect of the communication apparatus according to the seventh aspect, refer to technical effect of the communication method in any implementation of the first aspect to the third aspect. Details are not described herein again.

According to an eighth aspect, a communication system is provided. The communication system includes the communication apparatus according to the fourth aspect and the communication apparatus according to the fifth aspect. Alternatively, the communication system includes the communication apparatus according to the fourth aspect and the communication apparatus according to the sixth aspect.

Alternatively, the communication system includes the communication apparatus according to the fourth aspect, configured to implement the method according to the first aspect, and the communication apparatus according to the fifth aspect, configured to implement the method according to the second aspect. Alternatively, the communication system includes the communication apparatus according to the fourth aspect, configured to implement the method according to the first aspect, and the communication apparatus according to the sixth aspect, configured to implement the method according to the third aspect.

According to a ninth aspect, a chip system is provided. The chip system includes a logic circuit and an input/output port. The logic circuit is configured to implement the processing functions in the first aspect to the third aspect, and the input/output port is configured to implement the receiving and sending functions in the first aspect to the third aspect. The input port may be configured to implement the receiving functions in the first aspect to the third aspect, and the output port may be configured to implement the sending functions in the first aspect to the third aspect.

In some embodiments, the chip system further includes a memory. The memory is configured to store program instructions and data for implementing the functions in the first aspect to the third aspect.

The chip system may include a chip, or may include a chip and another discrete component.

According to a tenth aspect, a computer-readable storage medium is provided. The computer-readable storage medium stores a computer program or instructions. When the computer program or the instructions are run on a computer, the communication method in any possible implementation of the first aspect to the third aspect is enabled to be performed.

According to an eleventh aspect, a computer program product is provided, including a computer program or instructions. When the computer program or the instructions are run on a computer, the communication method in any possible implementation of the first aspect to the third aspect is enabled to be performed.

In the implementations provided in the foregoing aspects of this application, the transmit end combines the source encoding result of the first bit sequence with some bit sequences in the first bit sequence to obtain the channel encoding input, namely, the fourth bit sequence, and performs channel encoding on the fourth bit sequence. In the process of decoding the to-be-decoded sequence, the receive end may perform joint decoding by using some bit sequences in the first bit sequence. The incorrect decoding result can be accurately determined by using the joint source and channel coding scheme, and the probability of detecting the incorrect decoding result can be increased, thereby improving the system performance.

DETAILED DESCRIPTION

The following describes technical solutions of this application with reference to accompanying drawings.

The technical solutions in embodiments of this application may be applied to various communication systems, for example, a wireless fidelity (Wi-Fi) system, a vehicle to everything (V2X) communication system, a device-to-device (D2D) communication system, an Internet of vehicles communication system, a 4th generation (4G) mobile communication system, for example, a long term evolution (LTE) system or a worldwide interoperability for microwave access (WiMAX) communication system, a 5th generation (5G) mobile communication system, for example, a new radio (NR) system, and a future communication system, for example, a 6th generation (6G) mobile communication system.

All aspects, embodiments, or features are presented in this application by describing a system that may include a plurality of devices, components, modules, and the like. It should be appreciated and understood that, each system may include another device, component, module, and the like, and/or may not include all devices, components, modules, and the like discussed with reference to the accompanying drawings. In addition, a combination of these solutions may be used.

In addition, in embodiments of this application, terms such as "example" and "for example" are used to represent giving an example, an illustration, or description. Any embodiment or design scheme described as an "example" in this application should not be explained as being more preferred or having more advantages than another embodiment or design scheme. The term "example" is used to present a concept in a specific manner.

A network architecture and a service scenario described in embodiments of this application are intended to describe the technical solutions in embodiments of this application more clearly, and do not constitute a limitation on the technical solutions provided in embodiments of this application. A person of ordinary skill in the art may know that with evolution of a network architecture and emergence of a new service scenario, the technical solutions provided in embodiments of this application are also applicable to similar technical problems.

Figure 1:
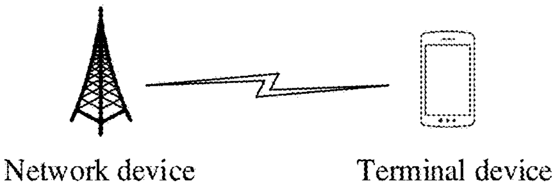
FIG. 1 is a schematic diagram of an architecture of a communication system according to an embodiment of this application.

For ease of understanding embodiments of this application, a communication system shown in FIG. 1 is first used as an example to describe in detail a communication system applicable to embodiments of this application. For example, FIG. 1 is a schematic diagram of an architecture of a communication system to which a communication method according to embodiments of this application is applicable.

As shown in FIG. 1, the communication system includes a terminal device and a network device. There may be one or more terminal devices, and there may be one or more network devices.

The terminal device is a terminal that accesses the communication system and has a wireless transceiver function, or a chip or a chip system that may be disposed in the terminal. The terminal device may also be referred to as user equipment (UE), a user apparatus, an access terminal, a subscriber unit, a subscriber station, a mobile station (MS), a remote station, a remote terminal, a mobile device, a user terminal, a terminal, a terminal unit, a terminal station, a terminal apparatus, a wireless communication device, a user agent, or a user apparatus.

For example, the terminal device in embodiments of this application may be a mobile phone, a wireless data card, a personal digital assistant (PDA) computer, a laptop computer (laptop computer), a tablet computer (Pad), an unmanned aerial vehicle, a computer with a wireless transceiver function, a machine type communication (MTC) terminal, a virtual reality (VR) terminal device, an augmented reality (AR) terminal device, an Internet of things (IoT) terminal device, a wireless terminal in industrial control (industrial control), a wireless terminal in self driving, a wireless terminal in telemedicine, a wireless terminal in a smart grid, a wireless terminal in transportation safety, a wireless terminal in a smart city, a wireless terminal (for example, a game machine, a smart television, a smart speaker, a smart refrigerator, or fitness equipment) in a smart home, a vehicle-mounted terminal, or an RSU with a terminal function. The access terminal may be a cellular phone, a cordless phone, a session initiation protocol (SIP) phone, a wireless local loop (WLL) station, a personal digital assistant (PDA), a handheld device (handset) with a wireless communication function, a computing device or another processing device connected to a wireless modem, a wearable device, or the like.

For another example, the terminal device in embodiments of this application may be an express delivery terminal (for example, a device that can monitor a location of a cargo vehicle, or a device that can monitor a temperature and humidity of cargo) in intelligent logistics, a wireless terminal (for example, a wearable device that can collect related data of poultry and livestock) in intelligent agriculture, a wireless terminal (for example, a smart elevator, a fire monitoring device, or a smart meter) in intelligent architecture, a wireless terminal (for example, a wearable device that can monitor a physiological status of a person or an animal) in intelligent healthcare, a wireless terminal (for example, an intelligent bus, an intelligent vehicle, a shared bicycle, a charging pile monitoring device, intelligent traffic lights, or an intelligent monitoring and intelligent parking device) in intelligent transportation, or a wireless terminal (for example, a vending machine, a self-service checkout machine, or an unmanned convenience store) in intelligent retail. For another example, the terminal device in this application may be a vehicle-mounted module, a vehicle-mounted assembly, a vehicle-mounted component, a vehicle-mounted chip, or a vehicle-mounted unit that is built in a vehicle as one or more components or units. The vehicle may implement the method provided in this application by using the vehicle-mounted module, the vehicle-mounted assembly, the vehicle-mounted component, the vehicle-mounted chip, or the vehicle-mounted unit that is built in the vehicle.

The network device is a device that is located on a network side of the communication system and has a wireless transceiver function, or a chip or a chip system that can be disposed in the device. The network device includes but is not limited to: an access point (AP), for example, a home gateway, a router, a server, a switch, or a bridge, in a wireless fidelity (Wi-Fi) system, an evolved NodeB (eNB), a radio network controller (RNC), a NodeB (NB), a base station controller (BSC), a base transceiver station (BTS), a home base station (for example, a home evolved NodeB, or a home NodeB, HNB), a baseband unit (BBU), a wireless relay node, a wireless backhaul node, a transmission point (transmission reception point, TRP; or TP), or the like. The network device may alternatively be a gNB or a transmission point (TRP or TP) in a 5G system, for example, a new radio (NR) system, or one antenna panel or a group of antenna panels (including a plurality of antenna panels) of a base station in a 5G system. The network device may alternatively be a network node, for example, a BBU or a distributed unit (DU), that constitutes a gNB or a transmission point, a road side unit (RSU) with a base station function, or the like. The network device may alternatively be a satellite or a base station in various forms in the future.

It should be noted that in the communication system provided in embodiments of this application, when a device (including a network device or a terminal device) sends a bit sequence to another device (including a network device or a terminal device), the device that sends the bit sequence is a transmit end, and a device that receives the bit sequence is a receive end. The transmit end may implement functions such as signal generation and sending, and may be a network device or a terminal device. The receive end may implement functions such as signal obtaining and processing, and may be a network device or a terminal device. FIG. 1 is used as an example. In an uplink communication scenario, a network device sends a bit sequence to a terminal device. The network device is a transmit end, and the terminal device is a receive end. In a downlink communication scenario, a terminal device sends a bit sequence to a network device. The terminal device is a transmit end, and the network device is a receive end. Certainly, in the communication system provided in embodiments of this application, one terminal device may send a bit sequence to another terminal device. In this case, a transmit end and a receive end are different terminal devices. One network device may send a bit sequence to another network device. In this case, a transmit end and a receive end are different network devices.

In some possible cases, a transmit end may be used as a receive end to implement functions such as signal obtaining and processing. A receive end may be used as a transmit end to implement functions such as signal generation and sending. In other words, a physical device may be a transmit end, or may be a receive end, or may be both a transmit end and a receive end.

It should be noted that the solutions in embodiments of this application may also be used in another communication system, and a corresponding name may also be replaced with a name of a corresponding function in the another communication system.

It should be understood that FIG. 1 is merely a simplified schematic diagram of an example for ease of understanding. The communication system may further include another network device and/or another terminal device that are/is not shown in FIG. 1.

Figure 2:
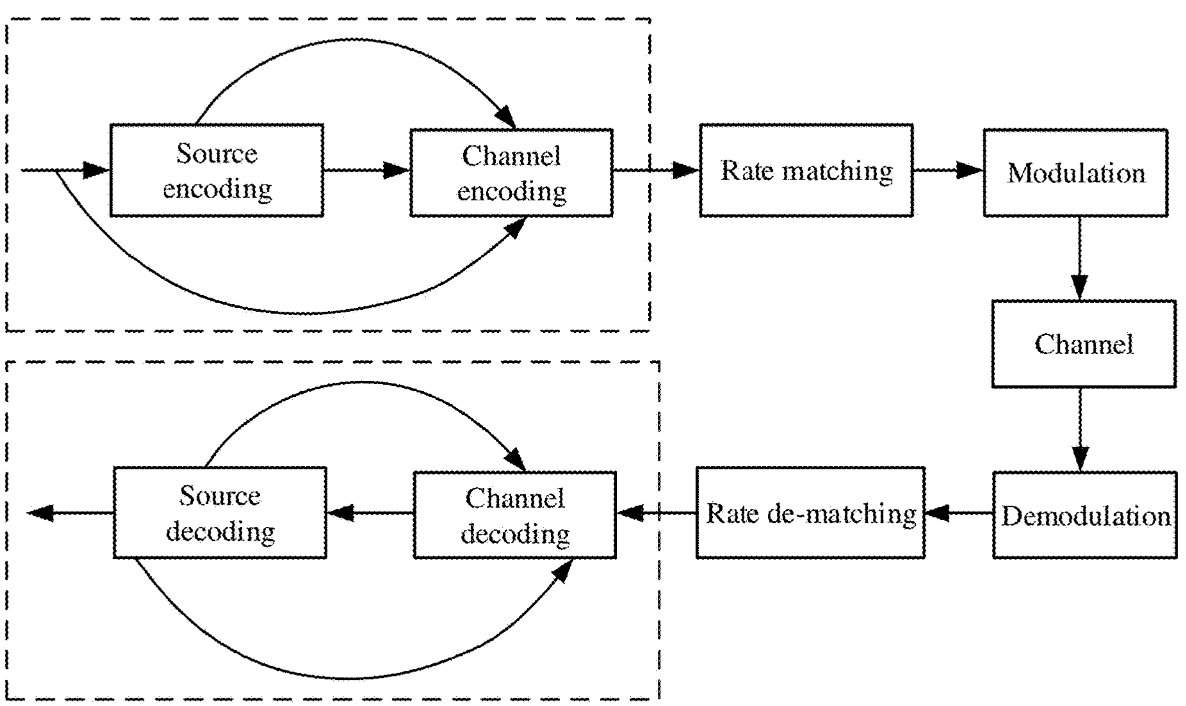
FIG. 2 is a schematic diagram of a signal processing process according to an embodiment of this application.

In a signal processing process between the transmit end and the receive end, as shown in FIG. 2, at the transmit end, source encoding, channel encoding, rate matching, and modulation are sequentially performed on a source, and a signal is sent to the receive end on a channel. After receiving the signal sent by the transmit end, the receive end obtains a sink by sequentially performing demodulation, rate de-matching, channel decoding, and source decoding on the signal. The method provided in embodiments of this application may be applied to a process of joint source and channel encoding at the transmit end and joint source and channel decoding at the receive end. The method provided in embodiments of this application may be performed by encoders at the transmit end and decoders at the receive end. The encoders may include a source encoder and a channel encoder, and the decoders may include a source decoder and a channel decoder.

To make embodiments of this application clearer, the following uniformly describes some content and concepts related to embodiments of this application.

1: Polar Code

The polar code is a linear block code, and is a channel coding scheme that can be strictly proved to "reach" a channel capacity. The polar code is featured by high performance and low complexity, and may be used in a 5G control channel enhanced mobile broadband (eMBB) scenario.

An encoding process of the polar code is:

$$x_1^N = u_1^N \times G_N \cdot x_1^N$$

is polar code whose code length is N, $$u_1^N = \{u_1, u_2, \ldots, u_N\}$$

is a binary row vector whose length is N, $G_N=F^{\otimes n}$ is an encoding matrix, and $F^{\otimes n}$ indicates a Kronecker power of F, and is defined as $F^{\otimes n}=F\otimes F^{\otimes(n-1)}$, where $$F = \begin{bmatrix} 1 & 0 \\ 1 & 1 \end{bmatrix}.$$

In the encoding process of the polar code, some bits of $$u_1^N$$

may be used to carry information, and the bits that carry the information may be referred to as information bits. These information bits form an information bit set, and an index set of the information bits may be denoted as A. The other bits of $$u_1^N$$

may be set to a fixed value agreed upon in advance by a receive end and a transmit end, and are referred to as fixed bits, frozen bits, or frozen bit locations. The frozen bit may be set to 0, or may be set to any fixed value agreed upon in advance by the receive end and the transmit end. This is not limited.

Figure 3:
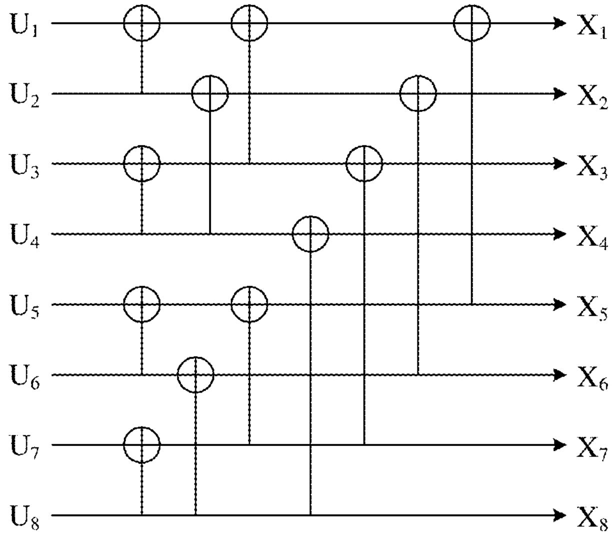
FIG. 3 is a schematic construction diagram of polar code according to an embodiment of this application.

As shown in FIG. 3, a matrix in which a row vector u is (U1, U2, U3, U4, U5, U6, U7, U8) and a generator matrix is 8×8 is used as an example. After the row vector u passes through the generator matrix, encoded bits may be vectors (X1, X2, X3, X4, X5, X6, X7, X8). The information bit may be mapped to a bit location corresponding to a polar channel with high reliability, and the frozen bit may be mapped to a bit location corresponding to a polar channel with low reliability. For example, in bit locations of the row vector u, {u1, u2, u3, u5} may be determined as locations of frozen bits, and {u4, u6, u7, u8} may be determined as locations of information bits. In this way, a to-be-encoded information vector whose length is 4 is mapped to the locations of the information bits.

When the frozen bit is set to 0, the encoding process of the polar code may be simplified as $$x_1^N = u_A \times G_N(A).$$

$u_A$ is an information bit set of $$u_1^N,$$

and a length of the information bit set is denoted as K. $G_N(A)$ is a submatrix that is in $G_N$ and that includes rows corresponding to indexes in the index set A of the information bits, and $G_N(A)$ is a K×N matrix. A construction process of the polar code is actually a selection process of the set A, and accuracy of the selection process determines performance of the polar code.

Figure 4:
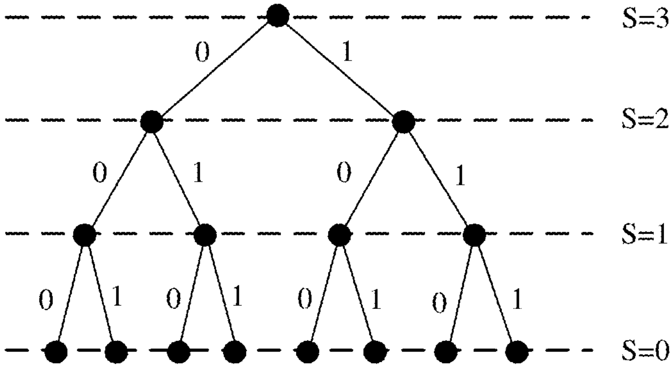
FIG. 4 is a schematic diagram of a decoding tree according to an embodiment of this application.

Successive cancellation (SC) decoding is a decoding algorithm of the polar code. Code whose code length is $N=2^n$ may correspond to an n-layer binary decoding code tree, and the SC decoding may be described as a process of searching for a correct decoding path in the decoding code tree. FIG. 4 shows a decoding tree of the polar code shown in FIG. 3. Bit-by-bit decoding starts from a root node (for example, a decoding node at a layer S=3) of the decoding code tree to a bottom layer (for example, decoding nodes at a layer S=0).

When a code length is finite, performance of using SC decoding for the polar code is not ideal. An improved algorithm may be obtained based on the SC decoding, for example, successive cancellation list decoding and successive cancellation stack decoding. The improved algorithm based on the SC decoding can be used to simultaneously reserve a plurality of decoding paths in a decoding process and finally output a decoding result with a maximum probability, and improve performance of the finite code length of the polar code. In addition, a cyclic redundancy check (CRC) may be used to assist in selecting a correct decoding result, thereby further improving the performance of the finite code length of the polar code.

As shown in FIG. 4, the decoding tree may have a plurality of layers of decoding nodes, and one circle in FIG. 4 indicates one decoding node. The decoding tree shown in FIG. 4 includes four layers of decoding nodes, and a three-layer decoding recursive operation needs to be performed on the decoding node at the layer S=3 to obtain the decoding nodes at the layer S=0.

One decoding path indicates a value of a bit of a decoded decoding node. For example, decoding nodes at a layer S=0 are obtained by using the decoding node at the layer S=3. If values of three decoded bits are: 000, 001, 010, 011, 100, 101, 110, and 111, 000 is a decoding path, 001 is a decoding path, 010 is a decoding path, 011 is a decoding path, 100 is a decoding path, 101 is a decoding path, 110 is a decoding path, and 111 is a decoding path.

2: Arithmetic Encoding

The arithmetic encoding is a lossless data compression method and an entropy encoding method. The arithmetic encoding differs from another entropy encoding method in the following aspects: In the arithmetic encoding, an entire input message is directly encoded, based on a probability of a source symbol, into a decimal n that meets ($0.0 \le n < 1.0$), while in the another entropy encoding method, an input message is usually divided into symbols, and then each symbol is encoded. When a symbol set and a probability of a symbol are given, a near-optimal encoding result can be given through arithmetic encoding. In a compression algorithm that uses the arithmetic encoding, a probability of an input symbol is usually estimated before the input symbol is encoded. The more accurate the estimation is, the closer an encoding result is to the optimal result.

A non-uniformly distributed binary source is used as an example. It is assumed that a probability of occurrence of 0 is $p_0$, and a probability of occurrence of 1 is $1-p_0$. An initial encoding interval is [0, 1). In an encoding process, a next source symbol is first read, and a next interval is determined based on a value of the symbol. It is assumed that a current encoding interval is [a, b). If a next symbol is 0, a new interval changes to $[a, a+(b-a)*p_0)$. If a next symbol is 1, a new interval changes to $[a+(b-a)*p_0, b)$. When all symbols are encoded, a finally obtained result interval is an encoded symbol sequence that is uniquely determined. Any person can obtain, through decoding and reconstruction, the symbol sequence by using the interval and a used model parameter. Actually, the final result interval does not need to be transmitted, and only any decimal in the interval needs to be transmitted. In practice, a shortest decimal in binary (or another numeral system) representation in the interval may be used as the encoding result, or a start point of the interval may be directly selected as the result.

Arithmetic encoding can be used to process both compression of a non-memory source and compression of a memory source. In this case, encoding may be performed in an adaptive interval determining mode. To be specific, a new encoding interval is determined based on a conditional distribution probability in a specific context, and adaptive update is performed with different contexts. A decoder may use a same model as an encoder.

The following describes in detail the communication method provided in embodiments of this application with reference to FIG. 5 to FIG. 9. The communication method provided in embodiments of this application may be applicable to a scenario in which source redundancy not only has non-uniformity, but also may have memory.

Figure 5:
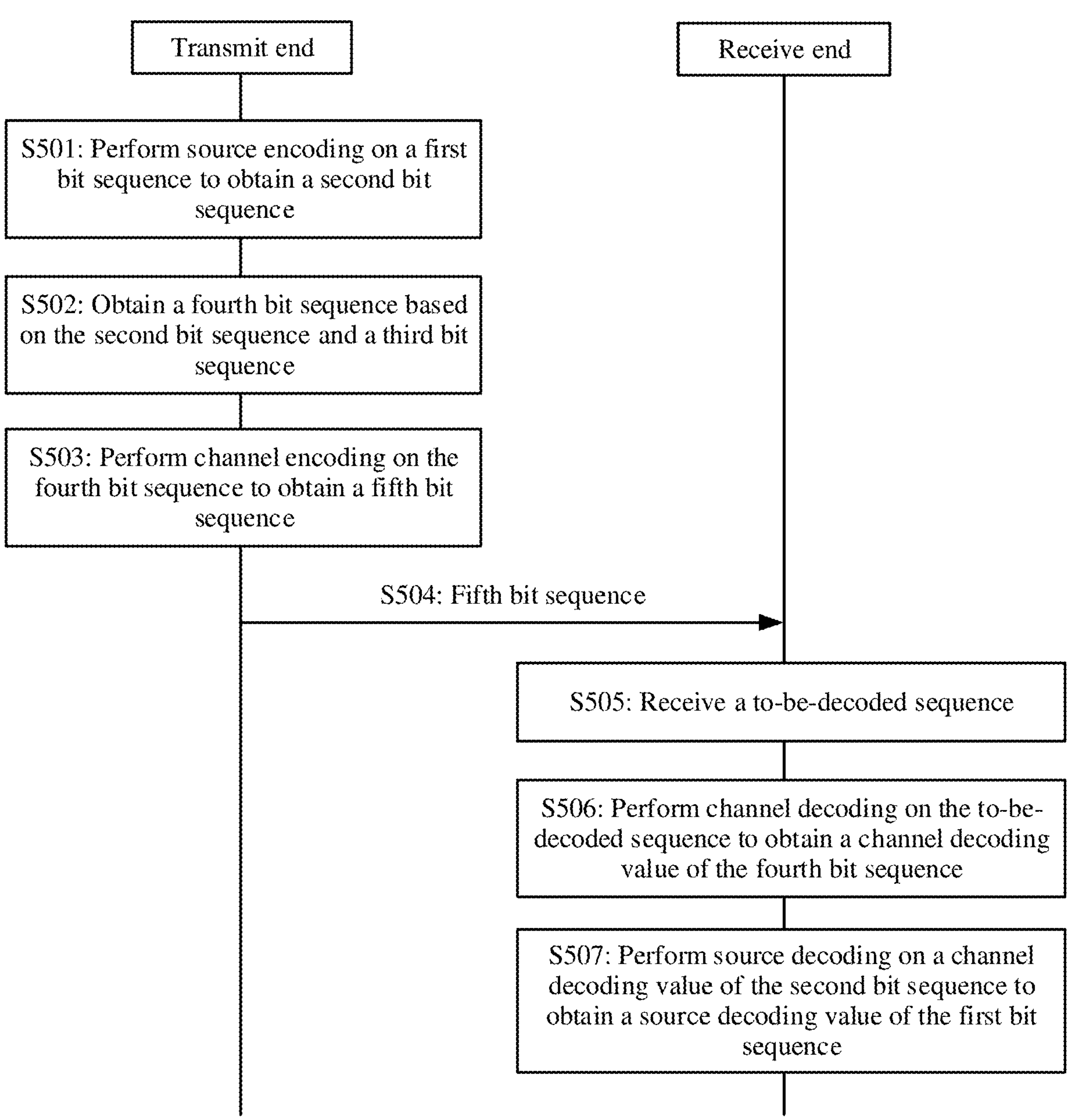
FIG. 5 is a schematic flowchart of a communication method according to an embodiment of this application.

For example, FIG. 5 is a schematic flowchart of a communication method according to an embodiment of this application.

As shown in FIG. 5, the communication method includes the following steps.

S501: A transmit end performs source encoding on a first bit sequence to obtain a second bit sequence.

For example, a length of the first bit sequence is A, and A is an integer greater than 0. A value of A is not limited in this application.

For example, a length of the second bit sequence is B, and B is an integer greater than 0. A value of B is not limited in this application.

It should be noted that there is no correlation between meanings of letters in the communication method provided in FIG. 5 to FIG. 9 in this application and meanings of letters in the foregoing descriptions of polar code and arithmetic encoding. This is subject to specific records. Without special description, in the following, A may indicate the length of the first bit sequence, and B may indicate the length of the second bit sequence. A general description is provided herein. Details are not described herein again.

Figure 6A:
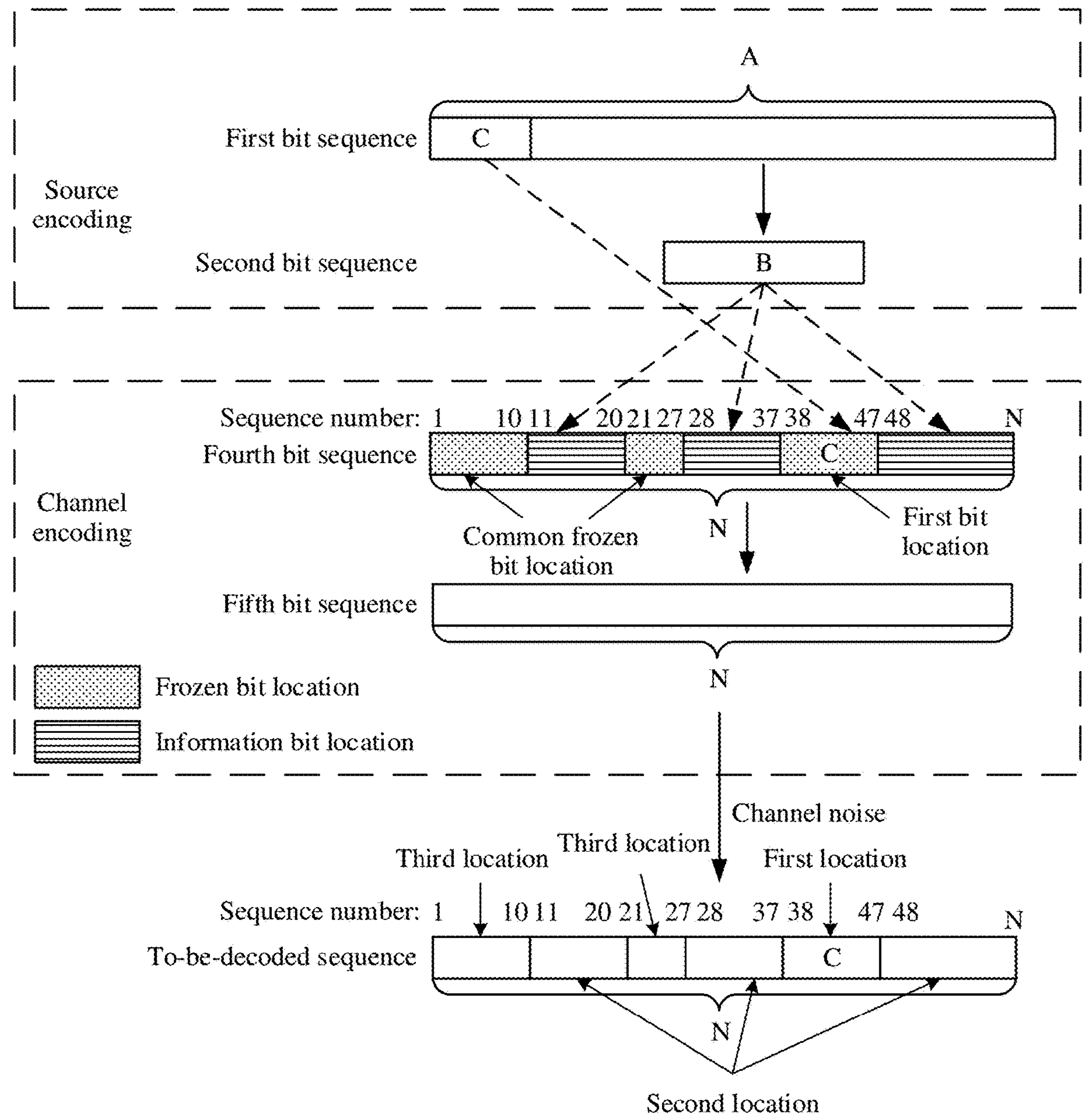
FIG. 6*a* to FIG. 6*g* are schematic diagrams of a plurality of types of encoding according to an embodiment of this application.
Figure 6B:
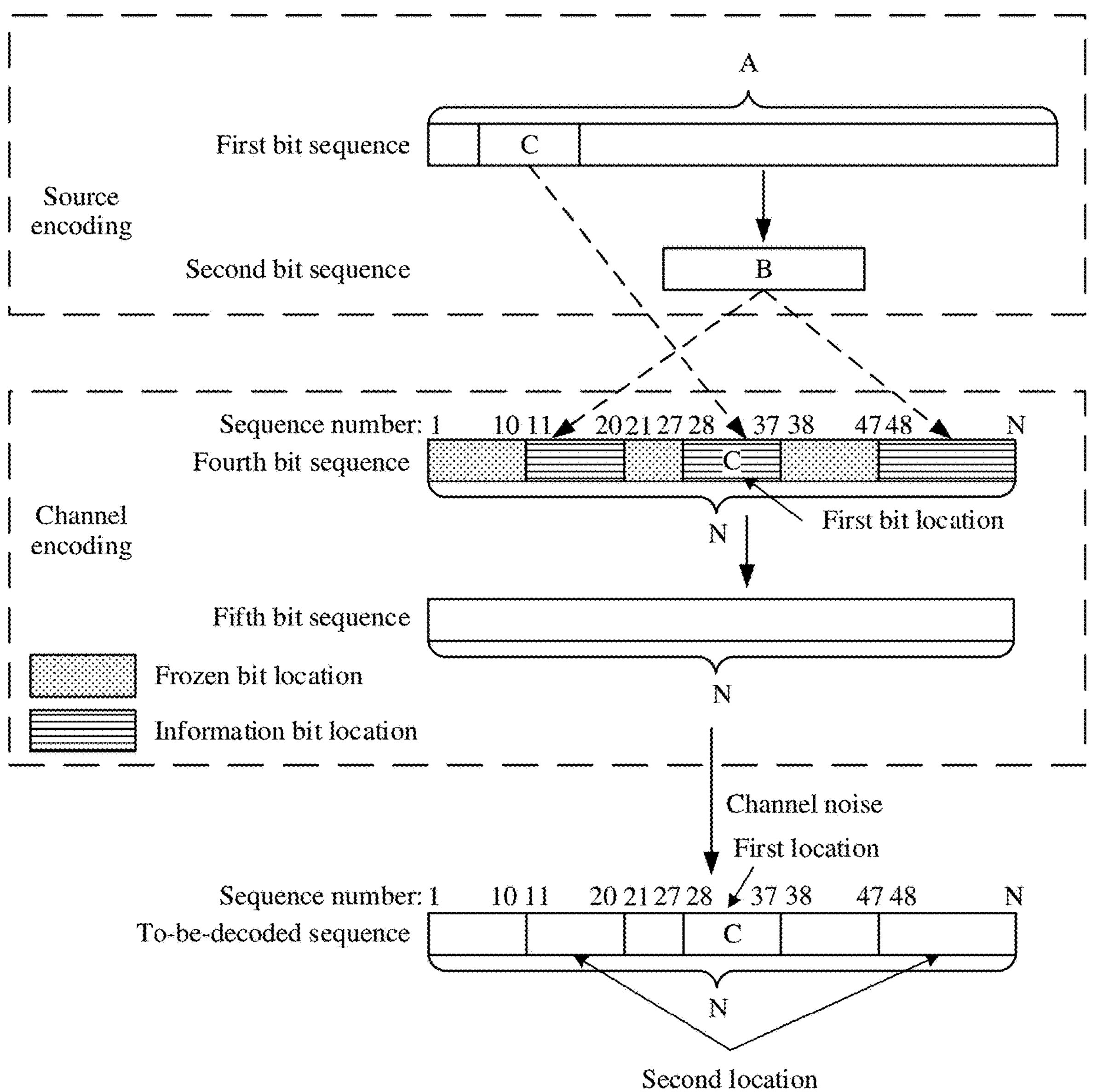
Figure 6C:
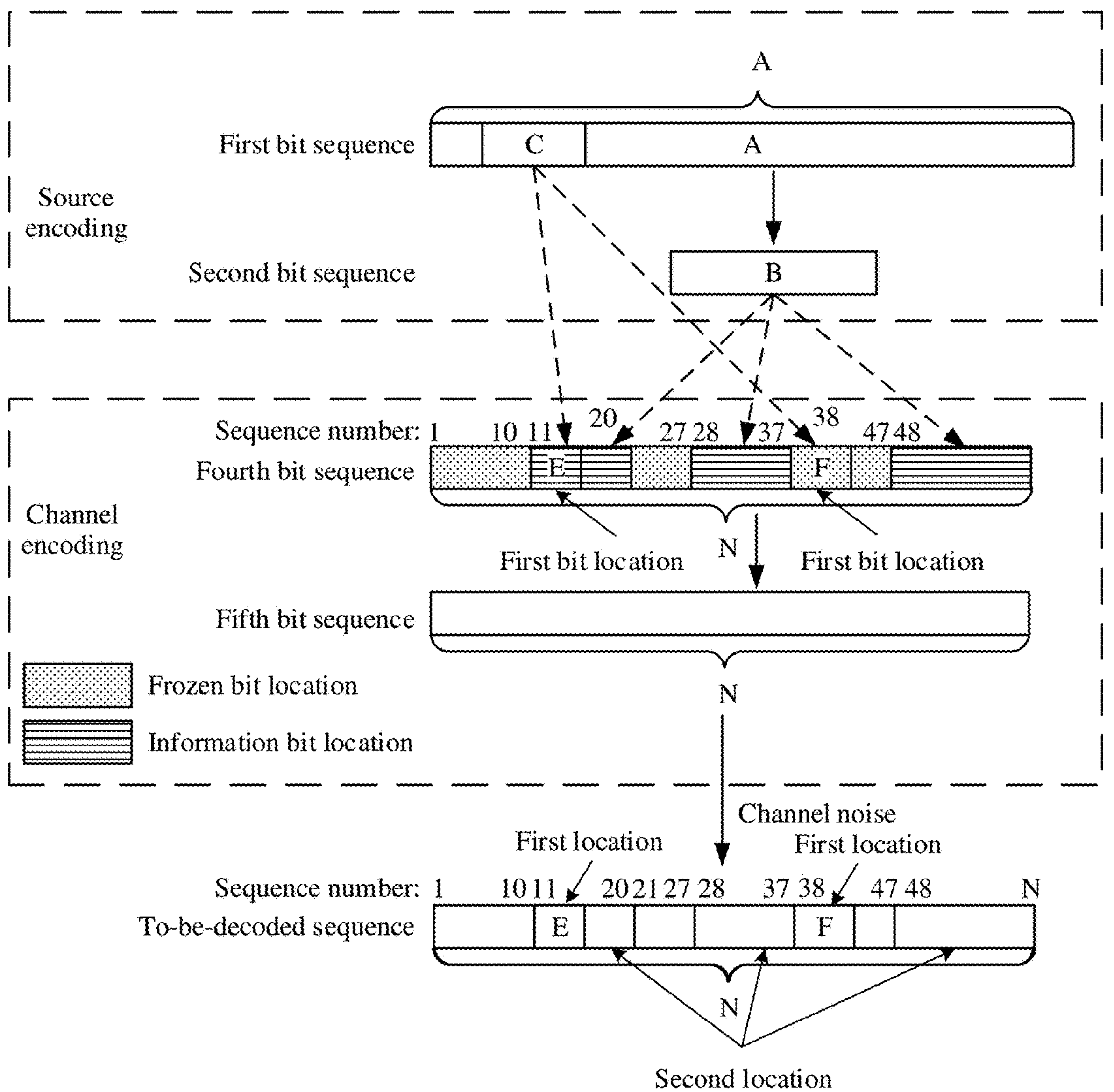

For example, as shown in FIG. 6*a*, FIG. 6*b*, and FIG. 6*c*, the transmit end performs source encoding on the first bit sequence to obtain the second bit sequence.

In some embodiments, the transmit end may perform source encoding on the first bit sequence through arithmetic encoding to obtain the second bit sequence, and the receive end may perform source decoding through arithmetic decoding.

In some embodiments, S501 may include S501-1 to S501-4.

S501-1: The transmit end performs bit-by-bit source encoding on the first bit sequence, and obtains a first source encoding value of the first bit sequence after performing source encoding on an $a^{th}$ bit in the first bit sequence.

In some embodiments, a is an integer greater than 0 and less than or equal to A.

Figure 6D:
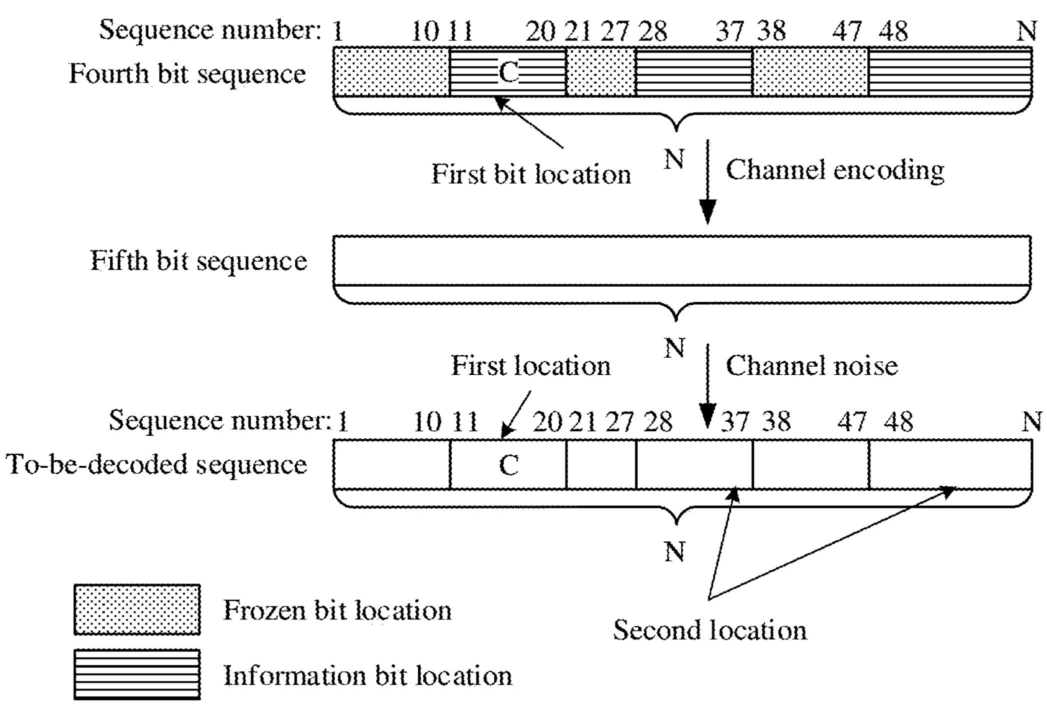
Figure 6E:
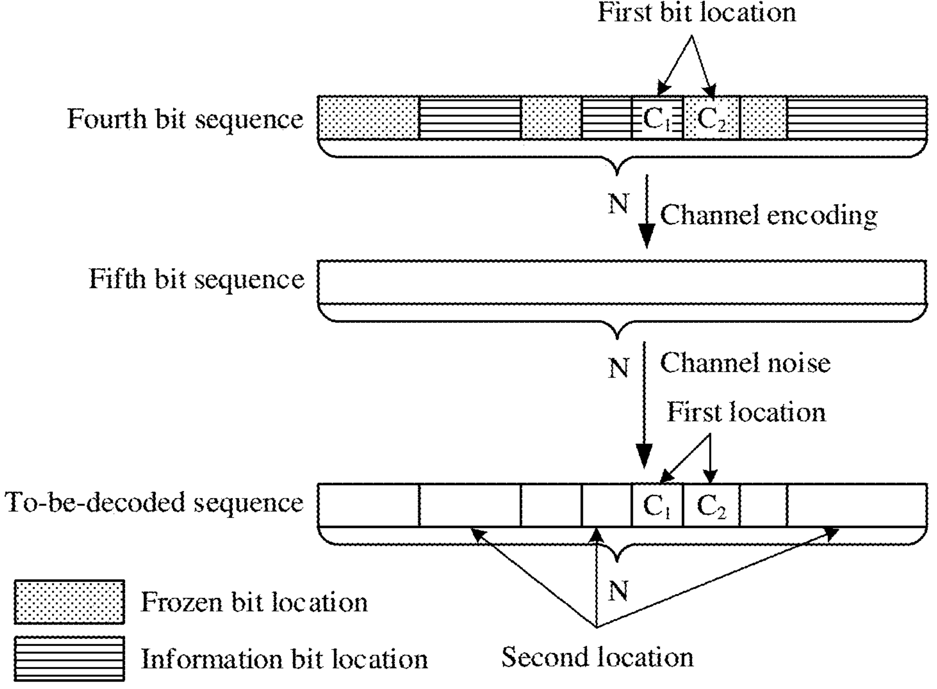
Figure 6F:
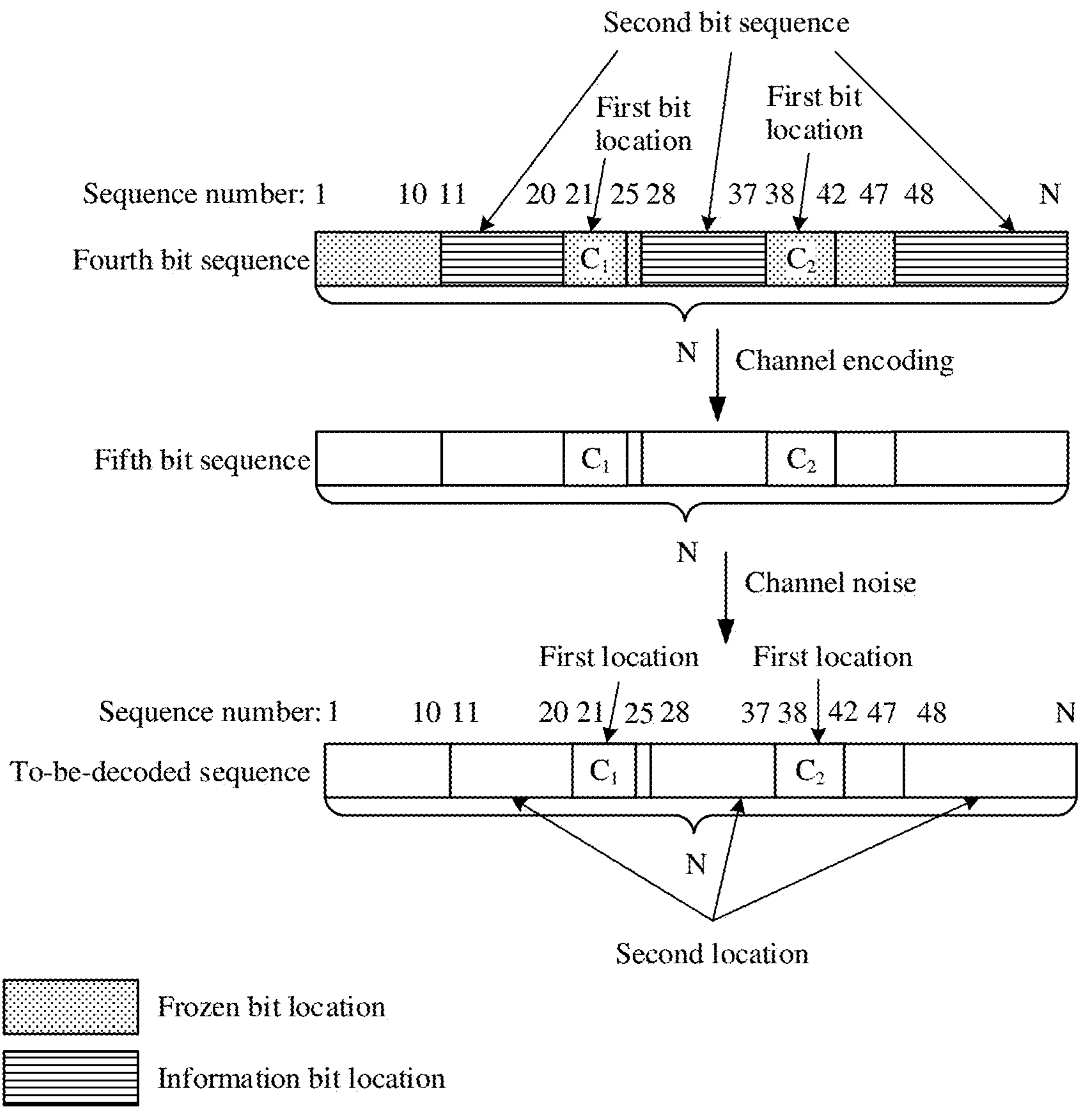
Figures 6G, 7:
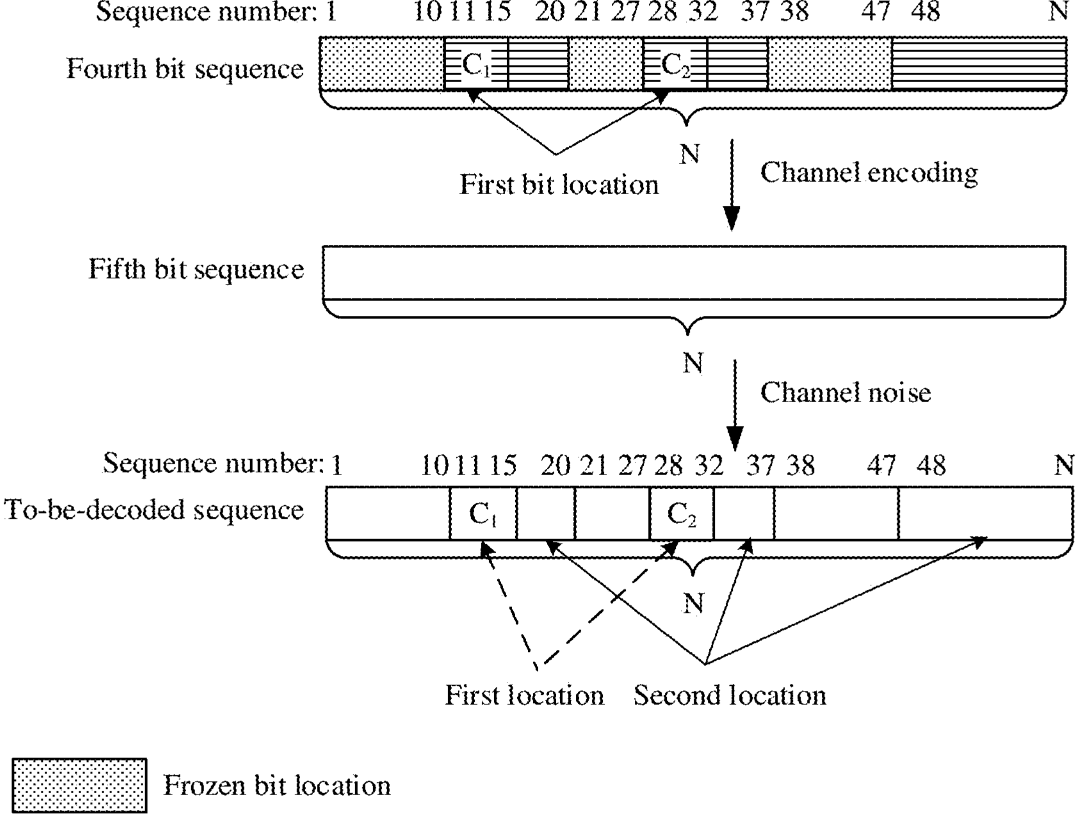
FIG. 7 is a schematic diagram of performing source encoding on a variable-length bit sequence to obtain a fixed-length bit sequence according to an embodiment of this application.

FIG. 7 is a schematic diagram of performing source encoding on a variable-length bit sequence to obtain a fixed-length bit sequence according to an embodiment of this application. As shown in FIG. 7, after source encoding is performed on a $1^{st}$ bit to a $50^{th}$ bit in the first bit sequence, the first source encoding value of the first bit sequence is obtained.

S501-2: Output the first source encoding value of the first bit sequence if a length of the first source encoding value of the first bit sequence is equal to a first length threshold.

In some embodiments, the first length threshold may be an integer greater than 0.

With reference to FIG. 7, it is assumed that the first length threshold may be 30 bits. If the length of the first source encoding value of the first bit sequence is exactly equal to 30, the first source encoding value of the first bit sequence is output.

In other words, bit-by-bit source encoding is performed on the first bit sequence. If a length of an encoding result is exactly equal to the first length threshold, the encoding result is directly output, and source encoding is continued from a next bit in the first bit sequence.

In some embodiments, the first source encoding value may include first length information, and the first length information may indicate that the first source encoding value is obtained after source encoding is performed on a first quantity of bits in the first bit sequence.

In other words, the first length information may indicate several bits that correspond to the first source encoding value and that are in the first bit sequence.

With reference to FIG. 7, after source encoding is performed on the $1^{st}$ bit to the $50^{th}$ bit in the first bit sequence, the first source encoding value of the first bit sequence is obtained. It is assumed that the length of the first length threshold is 30 bits, and the length of the first source encoding value of the first bit sequence is exactly equal to 30. In this case, the first length information may indicate the first quantity of 50. Source encoding is performed from a $51^{st}$ bit next time.

In some embodiments, the first length information may be placed in a bit location whose natural order ranks top in the first source encoding value.

S501-3: If the length of the first source encoding value of the first bit sequence is greater than the first length threshold, the transmit end deletes a second source encoding value from the first source encoding value to obtain a third source encoding value, pads zeros at the end of the third source encoding value, and outputs a fourth source encoding value.

In some embodiments, the second source encoding value is obtained by performing source encoding on the $a^{th}$ bit in the first bit sequence, and a length of the fourth source encoding value is equal to the first length threshold.

With reference to FIG. 7, it is assumed that the length of the first length threshold is 30 bits, the length of the first source encoding value of the first bit sequence is equal to 31, and the first source encoding value includes the third source encoding value and the second source encoding value. A length of the third source encoding value is 29, and is obtained by performing source encoding on the $1^{st}$ bit to the $49^{th}$ bit in the first bit sequence. A length of the second source encoding value is 2, and is obtained by performing source encoding on the $50^{th}$ bit in the first bit sequence. The second source encoding value may be deleted from the first source encoding value to obtain the third source encoding value whose length is 29. However, if the length of the third source encoding value is not equal to the first length threshold of 30, zeros may be padded at the end of the third source encoding value, so that the length of the third source encoding value is 30, and the third source encoding value obtained after the zeros are padded is output. Source encoding is performed from the $50^{th}$ bit next time.

In other words, the length of the first source encoding value is not necessarily exactly equal to the first length threshold. It is possible that a length of an encoding result obtained after an $(a-1)^{th}$ bit is encoded is less than the first length threshold, but a length of an encoding result obtained after the $a^{th}$ bit is encoded is greater than the first length threshold. In this case, an encoding bit that is of the first source encoding value and that corresponds to the $a^{th}$ bit may be deleted, and zeros are padded at the end of the first source encoding value, in which the encoding bit is deleted, to reach the first length threshold.

S501-4: If the $a^{th}$ bit is a last bit in the first bit sequence, and the length of the first source encoding value is less than the first length threshold, the transmit end pads zeros at the end of the first source encoding value, and outputs a fifth source encoding value.

In some embodiments, a length of the fifth source encoding value is equal to the first length threshold.

Similar to the first source encoding value, both the fourth source encoding value and the fifth source encoding value may include corresponding length information to indicate lengths of original sources corresponding to the source encoding values.

In other words, if the length of the first source encoding value obtained after source encoding is performed on the first bit sequence is less than the first length threshold, the first source encoding value may be output after zeros are padded at the end of the first source encoding value, so that source encoding values of all segments have a same length.

In some embodiments, bits of length information and zero-padded bits at the end that are of source encoding values (for example, the first source encoding value, the fourth source encoding value, the fifth source encoding value) may be referred to as non-uniform bits, and the non-uniform bits may be mapped to information bit locations with low reliability.

Figures 8, 9:
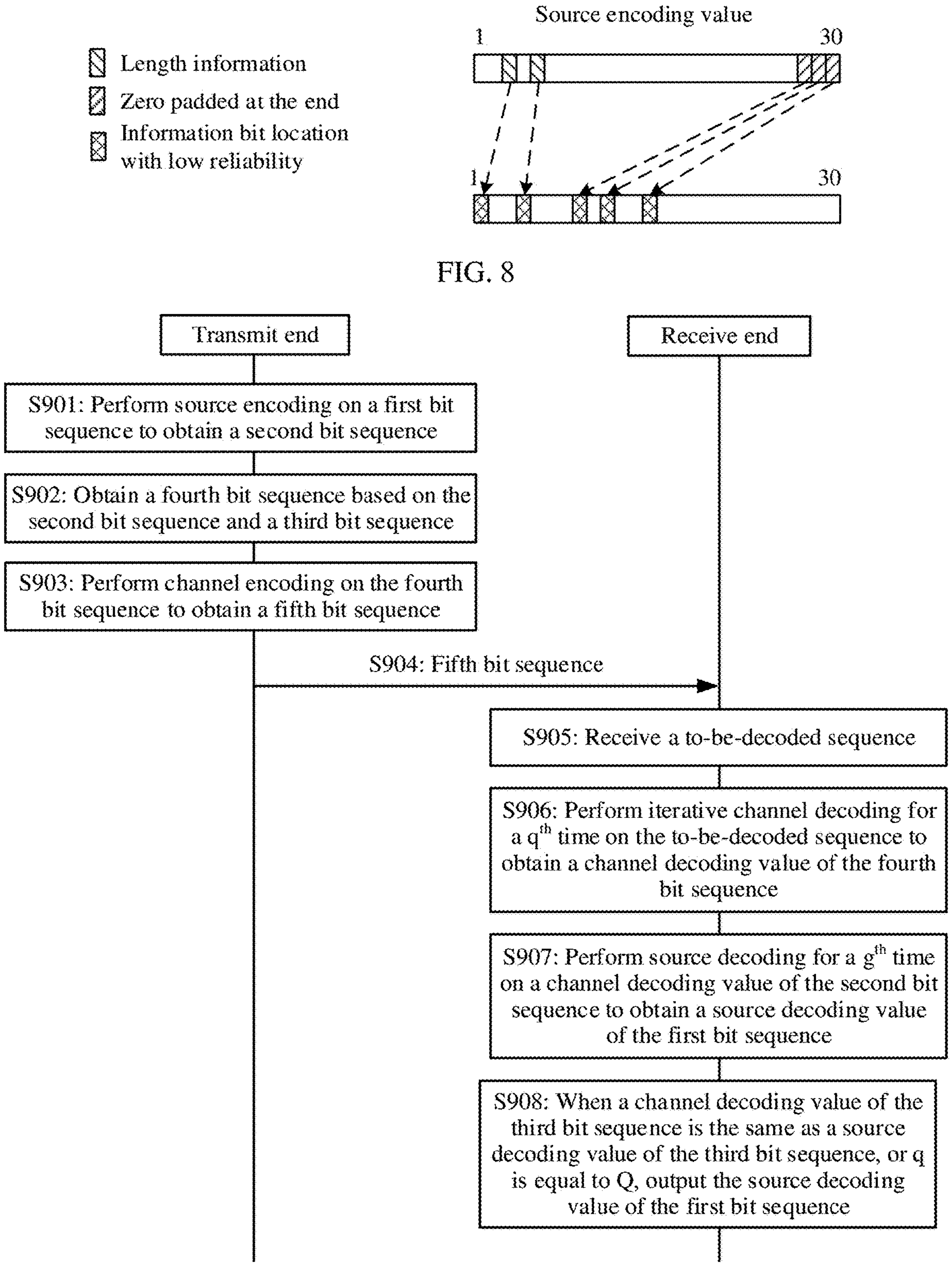
FIG. 8 is a schematic diagram of a source encoding value according to an embodiment of this application.
FIG. 9 is a schematic flowchart of another communication method according to an embodiment of this application.

With reference to FIG. 8, the bit of the length information and the zero-padded bit at the end are mapped to the information bit locations with low reliability, and operations such as channel encoding and decoding may be subsequently performed on the mapped source encoding value, so that a probability of detecting an incorrect decoding result can be increased.

In this way, the transmit end may compress signal sources of different lengths into a plurality of sequences of a same length, can achieve both lossless compression and a fixed output length, subsequently perform channel encoding by using a fixed code rate, and perform auxiliary decoding by using the compressed non-uniform bit, so that a decoding success rate can be increased.

S502: The transmit end obtains a fourth bit sequence based on the second bit sequence and a third bit sequence.

For example, the third bit sequence may be C bits in the first bit sequence, and C is an integer greater than 0 and less than or equal to A.

As shown in FIG. 6*a*, FIG. 6*b*, and FIG. 6*c*, the C bits may be selected from A bits in the first bit sequence as the third bit sequence.

It should be noted that the C bits in the third bit sequence may be C consecutive bits shown in FIG. 6*a*, FIG. 6*b*, and FIG. 6*c*, or may be C inconsecutive bits. This is not limited in this application.

In this way, the transmit end selects some bits in the first bit sequence and maps the some bits to the fourth bit sequence to use some of the original source bit sequence to assist in performing channel decoding, and does not modify a source encoding result. Therefore, whether a decoding result is accurate can be accurately determined, thereby increasing the decoding success rate.

In some embodiments, that the third bit sequence may be C bits in the first bit sequence may include: The third bit sequence is C bits whose natural orders rank top in the first bit sequence.

For example, it is assumed that the first bit sequence includes $a_1$, $a_2$, $a_3$, $a_4$, $a_5$, $a_6$, $a_7$, and $a_8$. $a_1$ may indicate a bit whose natural order ranks first, $a_2$ may indicate a bit whose natural order ranks second, $a_3$ may indicate a bit whose natural order ranks third, and similarly, as may indicate a bit whose natural order ranks eighth.

As shown in FIG. 6*a*, the third bit sequence may be C bits whose natural orders rank top in the first bit sequence.

In this way, the bits whose natural orders rank top in the first bit sequence are used as the third bit sequence, so that the bits can be checked earlier in a decoding process. Whether the decoding result is accurate can be determined earlier, and if an error occurs in the decoding result, decoding can be stopped earlier.

In some embodiments, the third bit sequence may be C bits whose natural orders rank middle in the first bit sequence, as shown in FIG. 6*b* and FIG. 6*c*.

It should be noted that the third bit sequence may be any C bits in the first bit sequence, for example, may be C bits whose natural orders rank low in the first bit sequence. This is not limited in this application.

For example, a length of the fourth bit sequence is N, and N is an integer greater than 0. The fourth bit sequence may include one or more information bits and one or more frozen bits.

For example, the second bit sequence may be located on B information bit locations in the fourth bit sequence.

As shown in FIG. 6*a*, FIG. 6*b*, and FIG. 6*c*, the second bit sequence may be mapped to the B information bit locations in the fourth bit sequence. The B information bit locations may be consecutive or inconsecutive. This is not limited in this application.

For example, the third bit sequence may be located on a first bit location in the fourth bit sequence. The first bit location may include E information bit locations and F frozen bit locations, E+F=C, and E is an integer greater than or equal to 0 and F is an integer greater than or equal to 0.

In other words, the transmit end may place all bits in the third bit sequence on the information bit locations in the fourth bit sequence; place all bits in the third bit sequence on the frozen bit locations in the fourth bit sequence; or place one part of bits in the third bit sequence on the information bit locations in the fourth bit sequence, and place the other part of bits on the frozen bit locations in the fourth bit sequence.

As shown in FIG. 6*a*, E=0 and F=C, and all of the third bit sequence is placed on C frozen bit locations in the fourth bit sequence.

As shown in FIG. 6*b*, E=C and F=0, and all of the third bit sequence is placed on C information bit locations in the fourth bit sequence.

As shown in FIG. 6*c*, E>0 and F>0, and all of the third bit sequence is placed on the E information bit locations and the F frozen bit locations in the fourth bit sequence.

It should be noted that the transmit end may place the C bits in the third bit sequence on C consecutive bit locations in the fourth bit sequence: as shown in FIG. 6*a*, placing the C bits in the third bit sequence on the C consecutive frozen bit locations; as shown in FIG. 6*b* or FIG. 6*d*, placing the C bits in the third bit sequence on the C consecutive information bit locations; or as shown in FIG. 6*e*, placing the C bits in the third bit sequence on C1 information bit locations and C2 frozen bit locations that are consecutively disposed.

Alternatively, the transmit end may place the C bits in the third bit sequence on C inconsecutive bit locations in the fourth bit sequence: as shown in FIG. 6*c*, placing the C bits in the third bit sequence on the E information bit locations and the F frozen bit locations that are inconsecutively disposed; as shown in FIG. 6*f*, placing the C bits in the third bit sequence on C1 frozen bit locations and C2 frozen bit locations that are inconsecutively disposed; or as shown in FIG. 6*g*, placing the C bits in the third bit sequence on C1 information bit locations and C2 information bit locations that are inconsecutively disposed. These are not enumerated one by one in embodiments of this application, where C1+C2=C.

In this way, mapping the third bit sequence to the frozen bit locations in the fourth bit sequence does not increase a bit rate of channel encoding, and system performance can be improved.

In some embodiments, E is equal to C and F is equal to 0, the first bit location meets a first principle, and the first principle may include: The first bit location is located on the E information bit locations whose natural orders rank top in the fourth bit sequence.

For example, it is assumed that the length of the third bit sequence is 10 and includes $c_1$ to $c_{10}$, and the length of the second bit sequence is 32 and includes $b_1$ to $b_{32}$. The third bit sequence is located on the first bit location, and the second bit sequence is located on another information bit location in the fourth bit sequence. For example, arrangement orders of the third bit sequence and the second bit sequence may be $c_1c_2 \ldots c_{10}b_1b_2 \ldots b_{32}$.

With reference to FIG. 6*d*, $c_1c_2 \ldots c_{10}$ may be located on C (C=10) information bit locations whose natural orders rank top in the fourth bit sequence shown in FIG. 6*d*, and $b_1b_2 \ldots b_{32}$ may be located on remaining information bit locations in the fourth bit sequence.

It should be noted that whether a frozen bit location is separated between the third bit sequence and the second bit sequence, between the bits in the third bit sequence, or between bits in the second bit sequence is not limited in this application. FIG. 6*d* is merely an example.

In this way, in the decoding process, whether the decoding result is accurate can be determined earlier, and decoding can be stopped earlier if the error occurs in the decoding result. Alternatively, in some embodiments, E is equal to C and F is equal to 0, and the first bit location meets a first principle, and the first principle may include: E bit locations in the first bit location are alternately arranged with B bit locations in the second bit sequence.

For example, in a case in which all the bits in the third bit sequence are located on information bit locations, it is assumed that the length of the third bit sequence is 10 and includes $c_1$ to $c_{10}$, and the length of the second bit sequence is 32 and includes $b_1$ to $b_{32}$. An arrangement order of the third bit sequence and the second bit sequence may be $c_1b_1c_2b_2c_3b_3c_4b_4c_5b_5c_6b_6c_7b_7c_8b_8c_9b_9c_{10}b_{10}b_{11} \ldots b_{32}$, $b_1c_1b_2c_2b_3c_3b_4c_4b_5c_5b_6c_6b_7c_7b_8c_8b_9c_9b_{10}c_{10}b_{11} \ldots b_{32}$, $c_1c_2b_1b_2c_3c_4b_3b_4 \ldots c_9c_{10}b_9b_{10}b_{11} \ldots b_{32}$, $b_1b_2b_3c_1c_2c_3 \ldots b_7b_8b_9c_7c_8c_9b_{10}c_{10}b_{11} \ldots b_{32}$, or the like.

It should be noted that specific alternate arrangement of the E bit locations in the first bit location and the B bit locations in the second bit sequence is not limited in embodiments of this application. In this application, whether a frozen bit location is separated between the bits in the third bit sequence and the bits in the second bit sequence in a case of the alternate arrangement is limited.

In this way, the E bit locations in the first bit location and the B bit locations in the second bit sequence are alternately arranged, so that after some bits are decoded in the decoding process, it can be determined whether a decoding result of the some bits is accurate. In comparison with a mode in which all of the third bit sequence and/or the second bit sequence need to be decoded, whether the decoding result of the some bits is accurate can be determined earlier, and if an error occurs in the decoding result, decoding can be stopped earlier.

In some embodiments, the case in which the E bit locations in the first bit location and the B bit locations in the second bit sequence are alternately arranged is also applicable to a case in which E is greater than 0 and F is greater than 0.

In some embodiments, F is equal to C and E is equal to 0, the first bit location meets a second principle, and the second principle may include: The first bit location in the fourth bit sequence corresponds to a first location in a to-be-decoded sequence, where after source decoding is performed on a result obtained by performing channel decoding on a value before the first location in the to-be-decoded sequence, source decoding values of one or more bits in the third bit sequence can be obtained; or the first bit location is located on the F frozen bit locations whose natural orders rank low in the fourth bit sequence.

In some embodiments, the to-be-decoded sequence is a sequence obtained after a fifth bit sequence is transmitted through a channel.

As shown in FIG. 6*a* or FIG. 6*f*, the transmit end performs channel encoding on the fourth bit sequence to obtain the fifth bit sequence, and sends the fifth bit sequence through the channel. The receive end receives the to-be-decoded sequence. The first location in the to-be-decoded sequence corresponds to the first bit location in the fourth bit sequence, the third bit sequence is located on the first bit location in the fourth bit sequence, and a bit sequence number of the first location in the to-be-decoded sequence is the same as a bit sequence number of the first bit location in the fourth bit sequence.

As shown in FIG. 6*a*, the first bit location may be located on C frozen bit locations whose natural orders rank low in the fourth bit sequence.

As shown in FIG. 6*a*, the C bits in the third bit sequence are located on the first bit location (a $38^{th}$ bit to a $47^{th}$ bit) in the fourth bit sequence, and the first location (a $38^{th}$ bit to a $47^{th}$ bit) that corresponds to the first bit location and that is in the to-be-decoded sequence meets: After source decoding is performed on a result obtained by performing channel decoding on values (for example, values of a $1^{st}$ bit to a $37^{th}$ bit) before the first location in the to-be-decoded sequence, source decoding values of the C bits in the third bit sequence can be obtained.

As shown in FIG. 6*f*, the C bits in the third bit sequence are located on the first bit location (a $21^{st}$ bit to a $25^{th}$ bit and a $38^{th}$ bit to a $42^{nd}$ bit) in the fourth bit sequence, and the first location (a $21^{st}$ bit to a $25^{th}$ bit) that corresponds to the first bit location (the $21^{st}$ bit to the $25^{th}$ bit) and that is in the to-be-decoded sequence meets: After source decoding is performed on a result obtained by performing channel decoding on bit locations (for example, values of a $1^{st}$ bit to a $20^{th}$ bit) before C1 bits in the to-be-decoded sequence, source decoding values of C1 bits corresponding to the third bit sequence can be obtained. The source decoding values of the C1 bits corresponding to the third bit sequence are used as channel decoding values at locations of the C1 bits in the to-be-decoded sequence.

It should be noted that, after source decoding is performed on a result obtained by performing channel decoding on a value at a location before the C1 locations in the to-be-decoded sequence, source decoding values of bits more than C1 (as shown in FIG. 6*f*, C1 is equal to 5) bits may be obtained. For example, source decoding values of six bits corresponding to the third bit sequence may be obtained.

In some embodiments, as shown in FIG. 6*f*, the first location (a $38^{th}$ bit to a $42^{nd}$ bit) that corresponds to the first bit location (a $38^{th}$ bit to a $42^{nd}$ bit) and that is in the to-be-decoded sequence meets: After source decoding is continued to be performed on a result obtained by performing channel decoding on bit locations (for example, values of a $21^{st}$ bit to a $37^{th}$ bit) before C2 bits in the to-be-decoded sequence, source decoding values of C2 bits corresponding to the third bit sequence can be obtained.

It should be noted that, after source decoding is performed on a result obtained by performing channel decoding on the bit locations before the C2 bits in the to-be-decoded sequence, source decoding values of bits less than C2 (as shown in FIG. 6*f*, C2 is equal to 6) bits may be obtained. For example, source decoding values of four bits corresponding to the third bit sequence may be obtained. In other words, it can be ensured that the source decoding values of the C2 bits corresponding to the third bit sequence can be obtained after source decoding is performed on the result obtained by performing channel decoding on the values before the C2 locations in the to-be-decoded sequence.

In this way, in the decoding process, if an error occurs in a channel decoding value of the second bit sequence, errors of a current decoding path are accumulated. Therefore, the decoding errors are easily identified, and the decoding success rate can be increased.

In some embodiments, the foregoing second principle is also applicable to a case in which E is greater than 0 and F is greater than 0.

In some embodiments, the first bit location may include the E information bit locations and the F frozen bit locations, and E is greater than 0 and F is greater than 0. The E information bit locations meet the first principle. To be specific, the E information bit locations are located on the E information bit locations (as shown in FIG. 6*c*) whose natural orders rank top in the fourth bit sequence, or the E bit locations are alternately arranged with the B bit locations in the second bit sequence. The F bit locations meet the second principle. To be specific, the first bit location in the fourth bit sequence corresponds to the first location in the to-be-decoded sequence, where after source decoding is performed on the result obtained by performing channel decoding on the value before the first location in the to-be-decoded sequence, source decoding values (as shown in FIG. 6*c*) of one or more bits in the third bit sequence can be obtained; or the F bit locations are located on the F frozen bit locations (as shown in FIG. 6*c*) whose natural orders rank low in the fourth bit sequence.

In some embodiments, that the third bit sequence is located on the first bit location in the fourth bit sequence may include: Scrambled third bit sequence is located on the first bit location in the fourth bit sequence.

In some embodiments, the scrambled third bit sequence is obtained based on a scrambling sequence and the third bit sequence.

For example, the first bit location may be the C information bit locations whose natural orders rank low in the fourth bit sequence.

In this way, in the decoding process, channel decoding may be performed on information bit locations whose natural orders rank first, scrambling the information bit in the fourth bit sequence does not increase a channel encoding bit rate, and the system performance can be improved. In addition, source decoding errors at a plurality of original source bit locations affect channel decoding at the bit locations, so that the probability of detecting the incorrect decoding result can be further increased.

S503: The transmit end performs channel encoding on the fourth bit sequence to obtain the fifth bit sequence.

A length of the fifth bit sequence is N, and N is an integer greater than 0.

As shown in FIG. 6*a*, channel encoding is performed on the fourth bit sequence to obtain the fifth bit sequence.

In this way, the fourth bit sequence is determined based on the second bit sequence and the third bit sequence, the third bit sequence is one or more bits in the original source bit sequence, channel encoding is directly performed by using some original source bits and a source encoding result of the original source bit sequence, and the system performance can be improved.

In some embodiments, the transmit end may perform channel encoding by using polar code encoding to obtain the fifth bit sequence, and the receive end may perform channel decoding by using polar code decoding. This is not limited in this application.

S504: The transmit end sends the fifth bit sequence.

As shown in FIG. 6*a*, the transmit end may send the fifth bit sequence through the channel.

S505: The receive end receives the to-be-decoded sequence.

For example, the length of the to-be-decoded sequence is N, and N is an integer greater than 0.

For example, the length of the to-be-decoded sequence is N, N is an integer greater than 0, and the to-be-decoded sequence is a sequence obtained after the fifth bit sequence is transmitted through the channel.

For example, the fifth bit sequence is a channel encoding value of the fourth bit sequence, the first location in the to-be-decoded sequence corresponds to the first bit location in the fourth bit sequence, the third bit sequence is located on the first bit location in the fourth bit sequence, the third bit sequence is the C bits in the first bit sequence, the length of the first bit sequence is A, A is an integer greater than 0, and C is an integer greater than 0 and less than or equal to A. A second location in the to-be-decoded sequence corresponds to the B information bit locations occupied by the second bit sequence in the fourth bit sequence, the second bit sequence is a source encoding value of the first bit sequence, the length of the second bit sequence is B, and B is an integer greater than 0. For details, refer to corresponding descriptions in S501 or S502. Details are not described herein again.

For example, the first bit location in the fourth bit sequence includes the E information bit locations and the F frozen bit locations, E+F=C, E is an integer greater than or equal to 0, and F is an integer greater than or equal to 0. For details, refer to corresponding descriptions in S502. Details are not described herein again.

In some embodiments, E is equal to C and F is equal to 0, the first bit location in the fourth bit sequence meets the first principle, and the first principle may include: The first bit location is located on the E information bit locations whose natural orders rank top in the fourth bit sequence. For a specific implementation, refer to corresponding descriptions in S502. Details are not described herein again.

In some embodiments, F is equal to C and E is equal to 0, the first bit location meets the second principle, and the second principle may include: The first bit location in the fourth bit sequence corresponds to the first location in the to-be-decoded sequence, where after source decoding is performed on the result obtained by performing channel decoding on the value before the first location in the to-be-decoded sequence, the source decoding values of the one or more bits in the third bit sequence can be obtained; or the first bit location is located on the C frozen bit locations whose natural orders rank low in the fourth bit sequence. For a specific implementation, refer to corresponding descriptions in S502. Details are not described herein again.

It should be noted that for a specific implementation of the first bit location in the fourth bit sequence, refer to corresponding descriptions in S502. Details are not described herein again.

S506: The receive end performs channel decoding on the to-be-decoded sequence to obtain a channel decoding value of the fourth bit sequence.

For example, the channel decoding value of the fourth bit sequence may include the channel decoding value of the second bit sequence and a channel decoding value of the third bit sequence.

In some embodiments, the receive end may perform channel decoding on the to-be-decoded sequence in a bit-by-bit decoding mode to obtain the channel decoding value of the fourth bit sequence. For example, the receive end may use a decoding structure of a list, a stack, or another type.

In some embodiments, S506 may include the following step 1 to step 4.

In some embodiments, a channel decoding mode may be an SCL mode, a quantity of lists is L, and L is an integer greater than 0.

An initial value of $c_u$ total is equal to 0, and if $c_{u\_total}$ is less than C, a following first source channel operation is performed (including the following step 1 to step 3).

Step 1: The receive end performs channel decoding on values of an $(n-m)^{th}$ bit to an $n^{th}$ bit in the to-be-decoded sequence to obtain a first decoding result.

In some embodiments, the $(n-m)^{th}$ bit to the $n^{th}$ bit include at least one location in the first location and/or b locations in the second location, n−m is an integer greater than 0, m is an integer greater than 0, and b is an integer greater than 0 and less than or equal to B.

In some embodiments, the first decoding result may include channel decoding values of b bits in the second bit sequence and/or a channel decoding value of at least one bit in the third bit sequence.

In other words, the receive end may perform channel decoding on a value of at least one bit in the first location and a value of at least one bit in the second location. The first decoding result may include a channel decoding value of at least one bit in the second bit sequence and a channel decoding value of at least one bit in the third bit sequence.

In some embodiments, when the receive end needs to perform the first source channel operation for a plurality of times to complete channel decoding on the to-be-decoded sequence, values of m may be equal or unequal in a process of performing the first source channel operation each time.

For example, the receive end starts to perform channel decoding from the value of the $1^{st}$ bit in the to-be-decoded sequence. In a process of performing the first source channel operation for a first time, channel decoding (m=5) may be performed on the values of the $1^{st}$ bit to the $6^{th}$ bit in the to-be-decoded sequence. In a process of performing the first source channel operation for a second time, channel decoding (m=7) may be performed on the values of the $7^{th}$ bit to the $14^{th}$ bit in the to-be-decoded sequence. Details are not described one by one.

In some embodiments, there may be one or more first decoding results, for example, there may be L first decoding results.

With reference to FIG. 6*b*, it is assumed that C=10 and B=32, and the $(n-m)^{th}$ bit to the $n^{th}$ bit may include the $1^{st}$ bit to the $28^{th}$ bit. The $11^{th}$ bit to the $20^{th}$ bit may be first 10 bits in the second location, and the $28^{th}$ bit may be a $1^{st}$ bit in the first location. Channel decoding is performed on the values of the $1^{st}$ bit to the $28^{th}$ bit, and the obtained first decoding result includes channel decoding values of the first 10 bits in the second bit sequence and a channel decoding value of the $1^{st}$ bit in the third bit sequence.

With reference to FIG. 6*d*, it is assumed that C=10 and B=32, and the $(n-m)^{th}$ bit to the $n^{th}$ bit may include the $1^{st}$ bit to the $28^{th}$ bit. The $11^{th}$ bit to the $20^{th}$ bit may be 10 bits in the first location, and the $28^{th}$ bit may be a $1^{st}$ bit in the second location. Channel decoding is performed on the values of the $1^{st}$ bit to the $28^{th}$ bit, and the obtained first decoding result includes channel decoding values of the first 10 bits in the third bit sequence and a channel decoding value of the $1^{st}$ bit in the second bit sequence.

With reference to FIG. 6*g*, it is assumed that C=10 and B=32, and the $(n-m)^{th}$ bit to the $n^{th}$ bit may include the $1^{st}$ bit to the $28^{th}$ bit. The $11^{th}$ bit to the $15^{th}$ bit may be first five bits in the first location, and the $16^{th}$ bit may be a $1^{st}$ bit in the second location. Channel decoding is performed on the values of the $1^{st}$ bit to the $16^{th}$ bit, and the obtained first decoding result includes channel decoding values of the first five bits in the third bit sequence and a channel decoding value of the $1^{st}$ bit in the second bit sequence.

For example, when the arrangement order of the third bit sequence and the second bit sequence is $c_1b_1c_2b_2c_3b_3c_4b_4c_5b_5c_6b_6c_7b_7c_8b_8c_9b_9c_{10}b_{10}b_{11} \ldots b_{32}$, the values of the $(n-m)^{th}$ bit to the $n^{th}$ bit may include $c_1b_1$, channel decoding is performed on the values of the $(n-m)^{th}$ bit to the $n^{th}$ bit, and the obtained first decoding result includes a channel decoding value of the $c_1$ bit in the third bit sequence and a channel decoding value of the $b_1$ bit in the second bit sequence.

For example, when the arrangement order of the third bit sequence and the second bit sequence is $c_1c_2b_1b_2c_3c_4b_3b_4 \ldots c_9c_{10}b_9b_{10}b_{11} \ldots b_{32}$, the values of the $(n-m)^{th}$ bit to the $n^{th}$ bit may include $c_1c_2b_1$, channel decoding is performed on the values of the $(n-m)^{th}$ bit to the $n^{th}$ bit, and the obtained first decoding result includes channel decoding values of the $c_1$ bit and the $c_2$ bit in the third bit sequence and a channel decoding value of the $b_1$ bit in the second bit sequence. This is not enumerated one by one in this application.

The receive end performs the first source channel operation for the second time, and continues to perform step 1 on the to-be-decoded sequence shown in FIG. 6*b*. The $(n-m)^{th}$ bit to the $n^{th}$ bit may include the $29^{th}$ bit to the $32^{nd}$ bit. The $29^{th}$ bit to the $32^{nd}$ bit may be the $2^{nd}$ bit to the $5^{th}$ bit in the first location. Channel decoding is performed on the values of the $29^{th}$ bit to the $32^{nd}$ bit, and the obtained first decoding result includes channel decoding values of the $2^{nd}$ bit to the $5^{th}$ bit in the third bit sequence.

The receive end performs the first source channel operation for the second time, and continues to perform step 1 on the to-be-decoded sequence shown in FIG. 6*d*. The $(n-m)^{th}$ bit to the $n^{th}$ bit may include the $29^{th}$ bit to the $37^{th}$ bit. The $29^{th}$ bit to the $37^{th}$ bit may be the $2^{nd}$ bit to the $10^{th}$ bit in the second location. Channel decoding is performed on the values of the $29^{th}$ bit to the $37^{th}$ bit, and the obtained first decoding result includes channel decoding values of the $2^{nd}$ bit to the $10^{th}$ bit in the second bit sequence.

The receive end performs the first source channel operation for the second time, and continues to perform step 1 on the to-be-decoded sequence shown in FIG. 6*g*. The $(n-m)^{th}$ bit to the $n^{th}$ bit may include the $17^{th}$ bit to the $20^{th}$ bit. The $17^{th}$ bit to the $20^{th}$ bit may be the $2^{nd}$ bit to the $4^{th}$ bit in the second location. Channel decoding is performed on the values of the $17^{th}$ bit to the $20^{th}$ bit, and the obtained first decoding result includes channel decoding values of the $2^{nd}$ bit to the $4^{th}$ bit in the second bit sequence. It should be noted that, in a process of performing the first source channel operation for the first time, channel decoding may be performed on the values of the $1^{st}$ bit to the $20^{th}$ bit in the to-be-decoded sequence. This is not limited in this application. The foregoing is merely an example provided in this application.

In some embodiments, the foregoing step 1 may be performed by a channel decoder of the receive end, and the channel decoder may feed back the obtained channel decoding values of the b bits in the second bit sequence to the source decoder to perform the following step 2.

Step 2: The receive end performs source decoding on the channel decoding values corresponding to the b bits in the second bit sequence to obtain source decoding values of $c_t$ bits in the third bit sequence.

In some embodiments, $c_t$ is an integer greater than 0 and less than or equal to C.

With reference to FIG. 6*b*, source decoding is performed on the channel decoding values of the first 10 bits in the second bit sequence to obtain the source decoding values of the $c_t$ bits in the third bit sequence. For example, $c_t$ is equal to 5.

With reference to FIG. 6*d* or FIG. 6*g*, source decoding is performed on the channel decoding value of the $1^{st}$ bit in the second bit sequence to obtain the source decoding values of the $c_t$ bits in the third bit sequence. For example, $c_t$ is equal to 1.

It should be noted that this is not listed one by one in this application provided that a source decoding value of the at least one bit in the third bit sequence is obtained.

When performing the first source channel operation for the second time, for the to-be-decoded sequence shown in FIG. 6*b*, the receive end may directly perform the following step 3 without performing step 2.

When performing the first source channel operation for the second time, for the to-be-decoded sequence shown in FIG. 6*d*, the receive end may perform source decoding on the channel decoding values corresponding to the $2^{nd}$ bit to the $10^{th}$ bit in the second bit sequence to obtain the source decoding values of the $c_t$ bits in the third bit sequence. For example, $c_t$ is equal to 9.

When performing the first source channel operation for the second time, for the to-be-decoded sequence shown in FIG. 6*g*, the receive end may perform source decoding on the channel decoding values corresponding to the $2^{nd}$ bit to the $4^{th}$ bit in the second bit sequence to obtain the source decoding values of the $c_t$ bits in the third bit sequence. For example, $c_t$ is equal to 4.

In some embodiments, step 2 may be performed by a source decoder of the receive end, and the source decoder may feed back the obtained source decoding values of the $c_t$ bits in the third bit sequence to the channel decoder.

Step 3: The receive end determines, based on source decoding values of $c_u$ bits in the third bit sequence and channel decoding values of $c_u$ bits corresponding to a natural order of the third bit sequence, to continue to perform, based on l decoding paths, the first source channel operation on values of an $(n+1)^{th}$ bit to an $N^{th}$ bit in the to-be-decoded sequence, and counts $c_u$ in $c_{u\_total}$.

In some embodiments, $c_u$ is an integer greater than 0, and l is an integer less than or equal to L.

In this way, whether the decoding result is correct may be determined based on the obtained source decoding value of the at least one bit in the third bit sequence and a channel decoding value of at least one bit corresponding to the natural order of the third bit sequence.

With reference to FIG. 6*b*, the receive end may determine, based on a source decoding value of a $1^{st}$ bit in source decoding values (obtained in step 2 when the first source channel operation is performed for the first time) of the first five bits in the third bit sequence, and the channel decoding value (obtained in step 1 when the first source channel operation is performed for the first time) of the $1^{st}$ bit in the third bit sequence, whether to continue to perform the first source channel operation, where $c_u$=1, 1 is counted in $c_{u\_total}$, and $c_{u\_total}$=1.

If the first source channel operation needs to be performed for the second time with reference to the to-be-decoded sequence shown in FIG. 6*b*, the receive end may determine, based on source decoding values (obtained in step 2 when the first source channel operation is performed for the first time) of the $2^{nd}$ bit to the $5^{th}$ bit in the third bit sequence, and the channel decoding values (obtained in step 1 when the first source channel operation is performed for the second time) of the $2^{nd}$ bit to the $5^{th}$ bit in the third bit sequence, whether to continue to perform the first source channel operation, where $c_u$=4, 4 is counted in $c_{u\_total}$ ($c_{u\_total}$=1) obtained after the first source channel operation is performed last time, and $c_{u\_total}$=1+4=5.

It should be noted that implementations of the to-be-decoded sequences shown in FIG. 6*b* and FIG. 6*g* in step 3 are similar to that in FIG. 6*b*. Details are not described herein again.

In some embodiments, step 3 may include the following steps 3a to 3c.

Step 3a: The receive end traverses the l decoding paths, and determines whether the source decoding values that correspond to a first decoding path and that are of the $c_u$ bits in the third bit sequence are the same as the channel decoding values that correspond to the first decoding path and that are of the $c_u$ bits corresponding to the natural order of the third bit sequence.

In some embodiments, the first decoding path may be one of the l decoding paths.

For example, $c_u$=2, and source decoding values of the $5^{th}$ bit and the $6^{th}$ bit in the third bit sequence are compared with the channel decoding values of the $5^{th}$ bit and the $6^{th}$ bit in the third bit sequence. If the source decoding value of the $5^{th}$ bit in the third bit sequence is the same as the channel decoding value of the $5^{th}$ bit in the third bit sequence, and the source decoding value of the $6^{th}$ bit in the third bit sequence is the same as the channel decoding value of the $6^{th}$ bit in the third bit sequence, it is determined that they are the same. Otherwise, it is determined that they are different.

In this way, whether a decoding result of the first decoding path is accurate can be accurately determined.

Step 3b: If they are different, the receive end determines to delete the first decoding path, and terminates the first source channel operation that is based on the first decoding path.

In this way, it is determined that the decoding result of the first decoding path is inaccurate, the first decoding path is deleted, and the first source channel operation is no longer continued to be performed, based on the first decoding path, on the values of the $(n+1)^{th}$ bit to the $N^{th}$ bit in the to-be-decoded sequence.

Step 3c: If they are the same, the receive end determines that the l decoding paths include the first decoding path.

In this way, it is determined that the decoding result of the first decoding path is accurate, the receive end may continue to perform, based on the first decoding path, the first source channel operation on the values of the $(n+1)^{th}$ bit to the $N^{th}$ bit in the to-be-decoded sequence.

Step 4: If $c_{u\_total}$ is equal to C and n is less than N, continue to perform channel decoding on the values of the $(n+1)^{th}$ bit to the $N^{th}$ bit in the to-be-decoded sequence.

In other words, if the foregoing step 3 has been performed based on a source decoding value of a last bit in the third bit sequence and a channel decoding value of a last bit corresponding to the natural order of the third bit sequence, and channel decoding has not been performed on all bits in the to-be-decoded sequence, channel decoding is continued to be performed on values at remaining locations in the to-be-decoded sequence to complete channel decoding. In this way, B channel decoding values of the second bit sequence and C channel decoding values of the third bit sequence are obtained.

In this way, in a channel decoding process, the receive end obtains the source decoding value of the third bit sequence based on the channel decoding value of the second bit sequence, and compares the source decoding value of the third bit sequence with the channel decoding value of the third bit sequence to accurately determine whether the decoding result is accurate, thereby improving the system performance.

In another possible design manner, S506 may include the following step 5 to step 9.

An initial value of $c_{t\_total}$ is equal to 0, and if $c_{t\_total}$ is less than C, a following second source channel operation is performed (including the following step 5 and step 6).

In some embodiments, the channel decoding mode may be the SCL mode, the quantity of lists is L, and L is an integer greater than 0.

Step 5: The receive end performs channel decoding on the values of the $(n-m)^{th}$ bit to the $n^{th}$ bit in the to-be-decoded sequence to obtain a second decoding result.

In some embodiments, the $(n+1)^{th}$ bit is one location in the first location, n−m is an integer greater than 0, and m is an integer greater than 0.

For example, it is assumed that C=10. For the to-be-decoded sequence shown in FIG. 6*a*, the $(n-m)^{th}$ bit to the $n^{th}$ bit in the to-be-decoded sequence may include the $1^{st}$ bit to the $37^{th}$ bit.

It is assumed that C=10. For the to-be-decoded sequence shown in FIG. 6*f*, the $(n-m)^{th}$ bit to the $n^{th}$ bit in the to-be-decoded sequence may include the $1^{st}$ bit to the $20^{th}$ bit. When the second source channel operation is performed for a second time on the to-be-decoded sequence shown in FIG. 6*f*, the $(n-m)^{th}$ bit to the $n^{th}$ bit in the to-be-decoded sequence may include the $21^{st}$ bit to the $37^{th}$ bit.

In some embodiments, the second decoding result may include the channel decoding values of the b bits in the second bit sequence.

In some embodiments, the second decoding result may further include a channel decoding value of the at least one bit in the third bit sequence.

For example, for the to-be-decoded sequence shown in FIG. 6*a*, channel decoding is performed on the values of the $1^{st}$ bit to the $37^{th}$ bit to obtain channel decoding values of first 20 bits in the second bit sequence.

For example, for the to-be-decoded sequence shown in FIG. 6*f*, channel decoding is performed on the values of the $1^{st}$ bit to the $20^{th}$ bit to obtain channel decoding values of first 10 bits in the second bit sequence.

When the second source channel operation is performed for the second time on the to-be-decoded sequence shown in FIG. 6*f*, channel decoding is performed on the values of the $21^{st}$ bit to the $37^{th}$ bit to obtain channel decoding values of the $11^{th}$ bit to the $20^{th}$ bit in the second bit sequence and channel decoding values of the $1^{st}$ bit to the $5^{th}$ bit in the third bit sequence.

In some embodiments, the foregoing step 5 may be performed by the channel decoder of the receive end, and the channel decoder may feed back the obtained channel decoding values of the b bits in the second bit sequence to the source decoder to perform the following step 6.

Step 6: The receive end performs source decoding on the channel decoding values of the b bits in the second bit sequence to obtain the source decoding values of the $c_t$ bits in the third bit sequence, and counts $c_t$ in $c_{t\_total}$.

In some embodiments, $c_t$ is an integer greater than 0 and less than or equal to C.

In some embodiments, the source decoding values of the $c_t$ bits in the third bit sequence are successively used as channel decoding values at $c_t$ locations in the first location in the to-be-decoded sequence.

In other words, the source decoding values that are obtained each time the second source channel operation is performed and that are of the $c_t$ bits in the third bit sequence are successively used as the channel decoding values at the $c_t$ locations in the first location in the to-be-decoded sequence. For example, if the second source channel operation is performed for a first time, source decoding values of five bits in the third bit sequence are obtained in step 6, and the source decoding values are used as channel decoding values of the $1^{st}$ bit to the $5^{th}$ bit in the first location in the to-be-decoded sequence. The second source channel operation is performed for a first time, source decoding values of three bits in the third bit sequence are obtained in step 6, and the source decoding values are used as channel decoding values of the $6^{th}$ bit to the $8^{th}$ bit in the first location in the to-be-decoded sequence.

With reference to FIG. 6*a*, it is assumed that C=10. The receive end performs source decoding on the channel decoding values of the first 20 bits in the second bit sequence to obtain source decoding values of 10 bits in the third bit sequence, where $c_t$ total is equal to 10. The obtained source decoding values of the 10 bits in the third bit sequence are successively used as channel decoding values of 10 locations in the first location in the to-be-decoded sequence.

With reference to FIG. 6*f*, it is assumed that C=10. The receive end performs source decoding on the channel decoding values of the first 10 bits in the second bit sequence to obtain source decoding values of the $1^{st}$ bit to the $5^{th}$ bit in the third bit sequence, where $c_{t\_total}$ is equal to 5. The obtained source decoding values of the $1^{st}$ bit to the $5^{th}$ bit in the third bit sequence are successively used as channel decoding values of the $21^{st}$ bit to the $25^{th}$ bit (namely, the first five bits in the first location) in the to-be-decoded sequence.

With reference to FIG. 6*f*, when the second source channel operation is performed for the second time, the receive end performs source decoding on the channel decoding values of the $11^{th}$ bit to the $20^{th}$ bit in the second bit sequence to obtain source decoding values of the $6^{th}$ bit to the $10^{th}$ bit in the third bit sequence, and counts 5 to $c_t$ total obtained after the second source channel operation is performed last time, where $c_{t\_total}$=5+5=10. The obtained source decoding values of the $6^{th}$ bit to the $10^{th}$ bit in the third bit sequence are successively used as channel decoding values of the $38^{th}$ bit to the $42^{nd}$ bit (namely, last five bits in the first location) in the to-be-decoded sequence.

In some embodiments, step 6 may be performed by the source decoder of the receive end, and the source decoder may feed back the obtained source decoding values of the $c_t$ bits in the third bit sequence to the channel decoder.

Step 7: If $c_{t\_total}$ is greater than 0 and less than C, the receive end continues to perform the second source channel operation on the values of the $(n+1)^{th}$ bit to the $N^{th}$ bit in the to-be-decoded sequence.

If $c_{t\_total}$ obtained in step 6 is greater than 0 and less than C, the receive end continues to perform the foregoing step 5 and step 6 on values of remaining bits in the to-be-decoded sequence.

For example, with reference to FIG. 6*f*, after the second source channel operation is performed for the first time, $c_t$ total is equal to 5 (refer to the foregoing step 6), the receive end continues to perform the second source channel operation on values of the $21^{st}$ bit to the $N^{th}$ bit in the to-be-decoded sequence.

In other words, if source decoding values of all the bits in the third bit sequence are not decoded, step 5 and step 6 continue to be performed.

In some embodiments, the foregoing step 7 may include: If $c_t$ total is greater than 0 and less than C, the receive end uses path metric values corresponding to the l decoding paths to determine to continue to perform, based on the l decoding paths, the second source channel operation on the values of the $(n+1)^{th}$ bit to the $N^{th}$ bit in the to-be-decoded sequence.

In this way, the receive end performs source decoding on the channel decoding value of the second bit sequence to obtain the source decoding value of the third bit sequence, and uses the source decoding value of the third bit sequence as the channel decoding value at the first location in the to-be-decoded sequence. In this way, if the channel decoding value of the second bit sequence is incorrect, the source decoding value of the third bit sequence is incorrect. Further, during decoding, the decoding error occurs when the first location in the to-be-decoded sequence is decoded. In this way, the errors of the current decoding path are accumulated, a path metric value corresponding to the current decoding path changes, the decoding error is easily identified, and the decoding success rate can be increased.

Step 9: If $c_t$ total is equal to C and n is less than N, the receive end continues to perform channel decoding on the values of the $(n+1)^{th}$ bit to the $N^{th}$ bit in the to-be-decoded sequence.

For example, with reference to FIG. 6*a*, after the second source channel operation is performed for the first time, $c_{t\_total}$ is equal to 10 (refer to the foregoing step 6), the receive end continues to perform channel decoding on the value of the $38^{th}$ bit and a value at a subsequent location in the to-be-decoded sequence.

For example, with reference to FIG. 6*f*, after the second source channel operation is performed for the second time, $c_t$ total is equal to 10 (refer to the foregoing step 6), the receive end continues to perform channel decoding on the value of the $38^{th}$ bit and a value at a subsequent location in the to-be-decoded sequence.

In this way, the B channel decoding values of the second bit sequence and the C channel decoding values of the third bit sequence are obtained.

In some embodiments, the foregoing step 9 may include: If $c_{t\_total}$ is equal to C and n is less than N, the receive end may use the path metric values corresponding to the l decoding paths to determine to continue to perform, based on the l decoding paths, the second source channel operation on the values of the $(n+1)^{th}$ bit to the $N^{th}$ bit in the to-be-decoded sequence.

In some embodiments, S506 may include the foregoing step 1 to step 4 and the foregoing step 5 to step 9.

For example, the first bit location includes the E information bit locations and the F frozen bit locations. When E is greater than 0 and F is greater than 0, the foregoing step 1 to step 4 and the foregoing step 5 to step 9 may be combined.

For example, for the to-be-decoded sequence shown in FIG. 6*c* and FIG. 6*e*, channel decoding may be performed by combining the foregoing step 1 to step 4 and the foregoing step 5 to step 9 to obtain the channel decoding value of the fourth bit sequence. Details are not described herein again.

In this way, the receive end may compare the source decoding value of the third bit sequence with the channel decoding value of the third bit sequence to determine whether the decoding result is accurate, and may use the source decoding value of the third bit sequence as the channel decoding value at the first location in the to-be-decoded sequence. Whether the decoding result is accurate is determined by using the path metric value corresponding to the decoding path, so that the probability of detecting the incorrect decoding result can be increased, thereby improving the system performance.

In some embodiments, when channel decoding is performed on a value at a third location in the to-be-decoded sequence, 0 may be directly assigned.

For example, the third location corresponds to a common frozen bit location in the fourth bit sequence, and the common frozen bit location refers to a frozen bit location that does not belong to the first bit location.

As shown in FIG. 6*a*, all of the $1^{st}$ bit location to the $10^{th}$ bit location and the $21^{st}$ bit location to the $27^{th}$ bit location in the fourth bit sequence may be referred to as common frozen bit locations.

In some embodiments, if the receive end can restore source decoding values of a first bit sequence whose length is greater than A by using obtained channel decoding values of the second bit sequence before performing channel decoding on a value of a last bit in the to-be-decoded sequence, an error occurs in a current decoding path, and the current decoding path is deleted.

In other words, an original length of the first bit is A, and the source decoding values of the first bit sequence whose length is greater than A are restored by using some channel decoding values of the second bit sequence. It is obvious that the error occurs in a decoding result, and channel decoding based on the current decoding path is stopped.

In some embodiments, after completing channel decoding on all values of the to-be-decoded sequence, the receive end may use the channel decoding value of the fourth bit sequence with a highest probability as a channel decoding output.

S507: The receive end performs source decoding on the channel decoding value of the second bit sequence to obtain the source decoding value of the first bit sequence.

For example, the channel decoding value of the second bit sequence is obtained from the channel decoding value of the fourth bit sequence, and source decoding on the channel decoding value of the second bit sequence is performed to obtain the source decoding value of the first bit sequence.

When source encoding is performed in the manner shown in S501-1 to S501-4, and when the non-uniform bit (for example, the bit occupied by the length information or the zero-padded bit) is obtained through decoding when source decoding is performed, if a value of the non-uniform bit ($b_1$) is 0, an offset, that is, $-\log P(b_1=0)$, is added to a path metric value of a decoding path corresponding to the bit; or if a value of the non-uniform bit is 1, an offset, that is, $-\log P(b_i=1)$, is added to a path metric value of a decoding path corresponding to the bit. $P(b_i)$ is a prior distribution probability of the bit. Path selection is performed, and non-uniform bits are inversely mapped to original locations.

Based on the communication method shown in FIG. 5, the transmit end combines the source encoding result of the first bit sequence with some bit sequences in the first bit sequence to obtain a channel encoding input, namely, the fourth bit sequence, and performs channel encoding on the fourth bit sequence. In the process of decoding the to-be-decoded sequence, the receive end may perform joint decoding by using some bit sequences in the first bit sequence. The incorrect decoding result can be accurately determined, and the probability of detecting the incorrect decoding result can be increased, thereby improving the system performance.

For example, FIG. 9 is a schematic flowchart of another communication method according to an embodiment of this application.

As shown in FIG. 9, the communication method includes the following steps.

S901: A transmit end performs source encoding on a first bit sequence to obtain a second bit sequence.

S902: The transmit end obtains a fourth bit sequence based on the second bit sequence and a third bit sequence.

S903: The transmit end performs channel encoding on the fourth bit sequence to obtain a fifth bit sequence.

S904: The transmit end sends the fifth bit sequence.

It should be noted that for specific implementations of S901 to S904, refer to the implementations of S501 to S504. Details are not described herein again. A main difference lies in that in the communication method shown in FIG. 5, the first bit location in the fourth bit sequence includes the E information bit locations and the F frozen bit locations, E+F=C, E is an integer greater than or equal to 0, and F is an integer greater than or equal to 0; and in the communication method shown in FIG. 9, a first bit location in the fourth bit sequence includes C information bit locations, and this belongs to a case in which E is equal to C and F is equal to 0.

For example, for specific implementations of S901 to S904 in the communication method shown in FIG. 9, refer to examples, in the communication method shown in FIG. 5, about FIG. 6*b*, FIG. 6*d*, and FIG. 6*g*, and another example in which E is equal to C and F is equal to 0.

S905: A receive end receives a to-be-decoded sequence.

For example, the to-be-decoded sequence is a sequence obtained after the fifth bit sequence is transmitted through a channel, the fifth bit sequence is a channel encoding value of the fourth bit sequence, a first location in the to-be-decoded sequence corresponds to the first bit location in the fourth bit sequence, the third bit sequence is located on the first bit location in the fourth bit sequence, the first bit location in the fourth bit sequence includes the C information bit locations, the third bit sequence is C bits in the first bit sequence, a length of the first bit sequence is A, A is an integer greater than 0, and C is an integer greater than 0 and less than or equal to A. A second location in the to-be-decoded sequence corresponds to B information bit locations occupied by the second bit sequence in the fourth bit sequence, the second bit sequence is a source encoding value of the first bit sequence, a length of the second bit sequence is B, and B is an integer greater than 0. For details, refer to corresponding descriptions in S501 or S502. Details are not described herein again.

S906: The receive end performs iterative channel decoding for a $q^{th}$ time on the to-be-decoded sequence to obtain a channel decoding value of the fourth bit sequence.

In some embodiments, q is an integer greater than 0.

For example, the channel decoding value of the fourth bit sequence may include a channel decoding value of the second bit sequence and a channel decoding value of the third bit sequence.

S907: The receive end performs source decoding for a $g^{th}$ time on the channel decoding value of the second bit sequence to obtain a source decoding value of the first bit sequence.

In some embodiments, g is an integer greater than 0. G may not be equal to q.

For example, after performing iterative channel decoding for a plurality of times on the to-be-decoded sequence, the receive end may perform source decoding for one time on the channel decoding value of the second bit sequence.

For example, the source decoding value of the first bit sequence may include a source decoding value of the third bit sequence.

In other words, the third bit sequence is one or more bits in the first bit sequence, and the source decoding values of the first bit sequence include source decoding values of all bits in the first bit sequence to include source decoding values of the C bits in the third bit sequence.

In some embodiments, S907 may include: When the channel decoding value of the fourth bit sequence passes a channel check, the receive end performs source decoding for a $g^{th}$ time on the channel decoding value of the second bit sequence to obtain the source decoding value of the first bit sequence.

For example, if the channel decoding value of the fourth bit sequence can pass a check mechanism of a channel decoder, source decoding is performed on the channel decoding value of the second bit sequence for the $g^{th}$ time to obtain the source decoding value of the first bit sequence, and obtain the source decoding value of the third bit sequence.

S908: When the channel decoding value of the third bit sequence is the same as the source decoding value of the third bit sequence, or q is equal to Q, the receive end outputs the source decoding value of the first bit sequence.

In some embodiments, Q is a maximum quantity of iterations, and Q is an integer greater than 0.

In other words, the receive end may compare the channel decoding value of the third bit sequence with the source decoding value of the third bit sequence, and output the source decoding value of the first bit sequence if they are the same. Alternatively, when a quantity of channel decoding iterations reaches the maximum quantity of iterations, the source decoding value of the first bit sequence is output.

In some embodiments, the communication method shown in FIG. 9 may further include: when the channel decoding value of the third bit sequence is different from the source decoding value of the third bit sequence, and q is less than Q, performing iterative channel decoding for a $(q+s)^{th}$ time on the to-be-decoded sequence, and performing source decoding for a $(g+t)^{th}$ time on the channel decoding value that is in a result obtained by performing iterative channel decoding for a $(q+s)^{th}$ time and that is of the second bit sequence.

In some embodiments, s is an integer greater than 0, and t is an integer greater than 0.

For example, after performing iterative channel decoding for a plurality of times on the to-be-decoded sequence, the receive end may perform source decoding for one time on the channel decoding value of the second bit sequence.

In other words, when the channel decoding value of the third bit sequence is the same as the source decoding value of the third bit sequence, and/or q is equal to Q, the receive end outputs a source decoding result, and stops performing channel decoding and source decoding.

Based on the communication method shown in FIG. 9, the receive end selects, from a result obtained by performing iterative channel decoding for a $q^{th}$ time on the to-be-decoded sequence, a channel decoding value of the second bit sequence to perform source decoding for a $g^{th}$ time to obtain the source decoding value of the first bit sequence; and when the channel decoding value of the third bit sequence is the same as the source decoding value of the third bit sequence, or the maximum quantity of iterations is reached, outputs the source decoding value of the first bit sequence, so that a probability of detecting an incorrect decoding result can be improved, thereby improving system performance.

Figure 10:
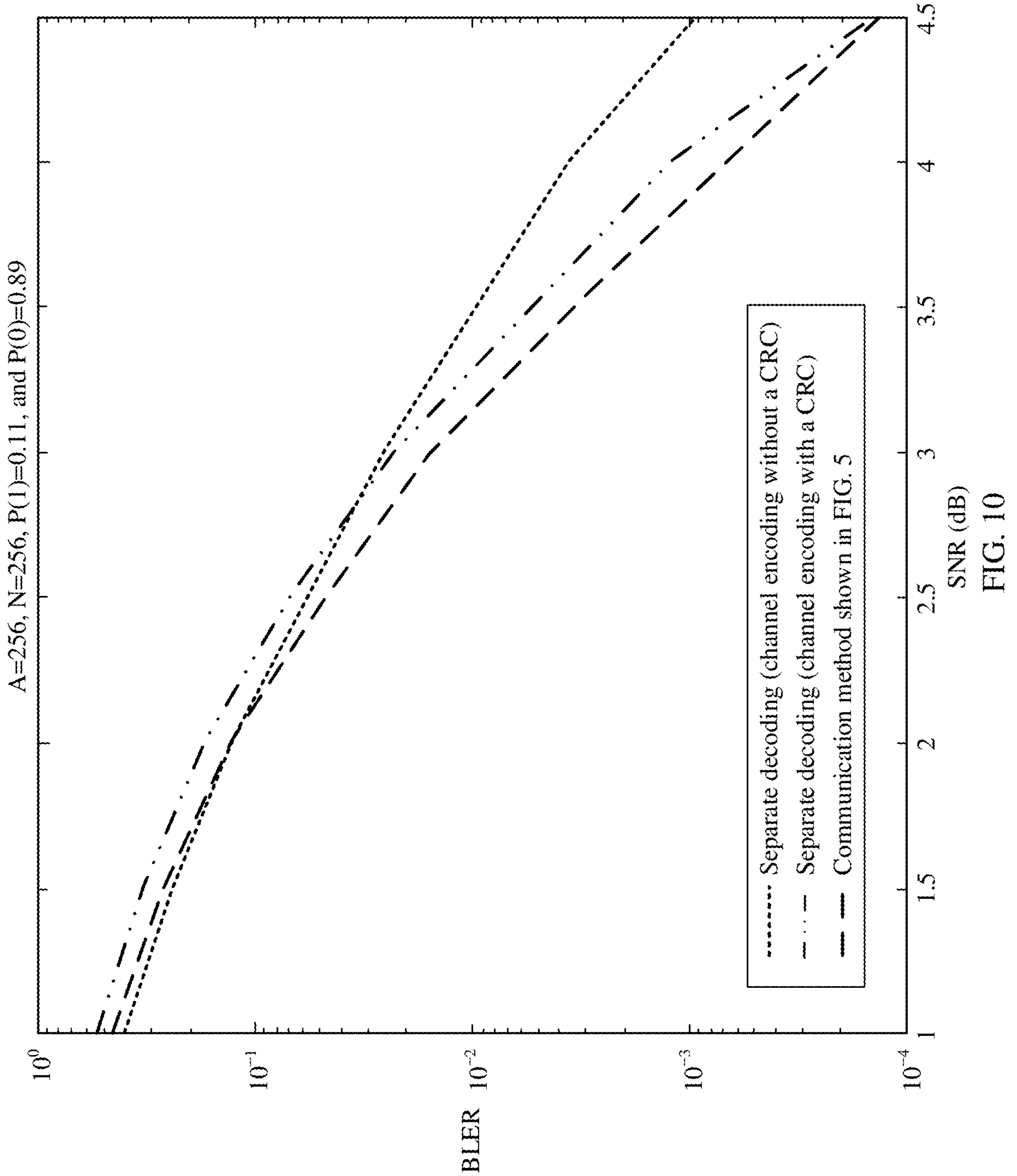
FIG. 10 is a schematic diagram of a type of block error rate performance according to an embodiment of this application.
Figure 11:
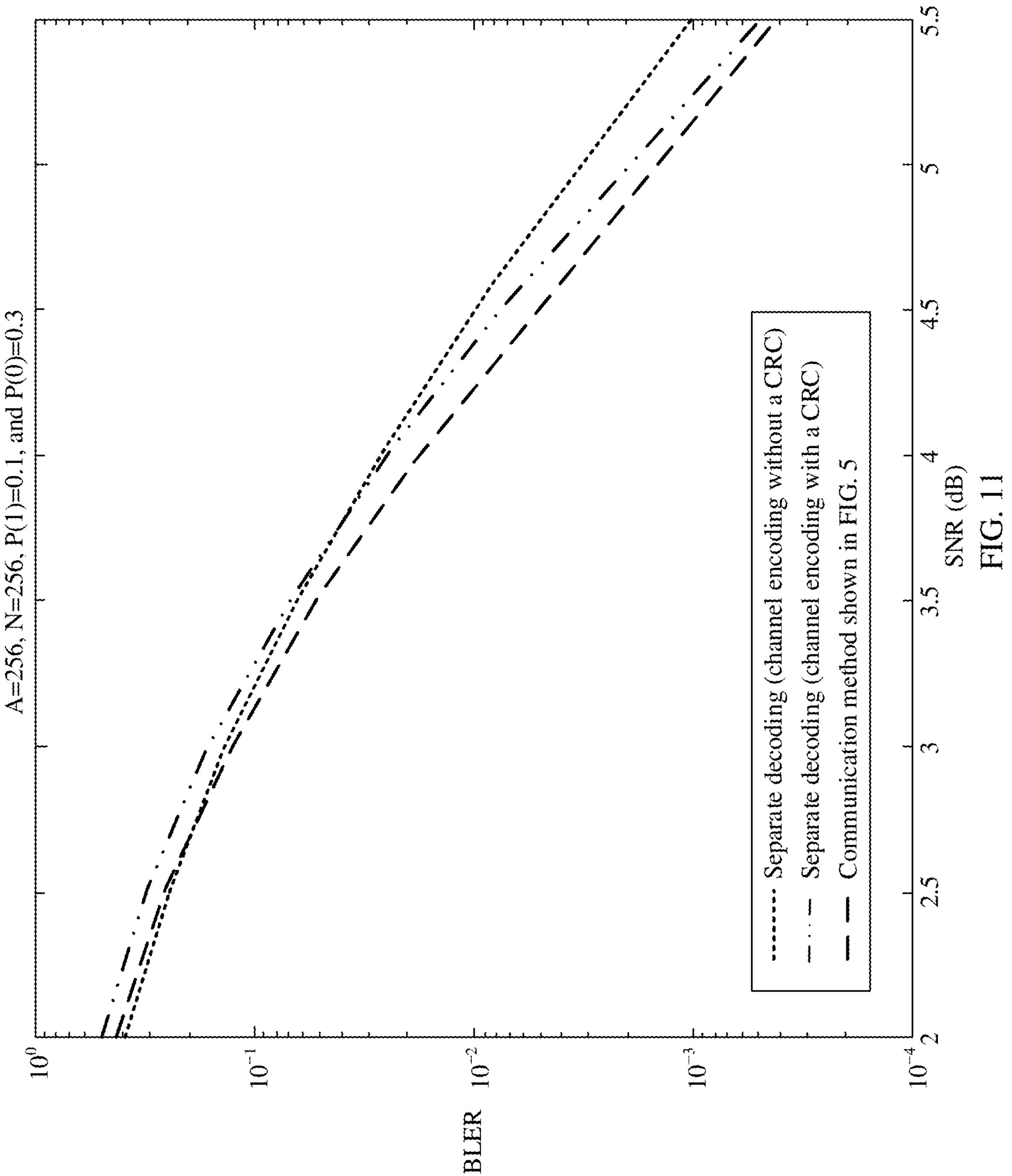
FIG. 11 is a schematic diagram of another type of block error rate performance according to an embodiment of this application.
Figure 12:
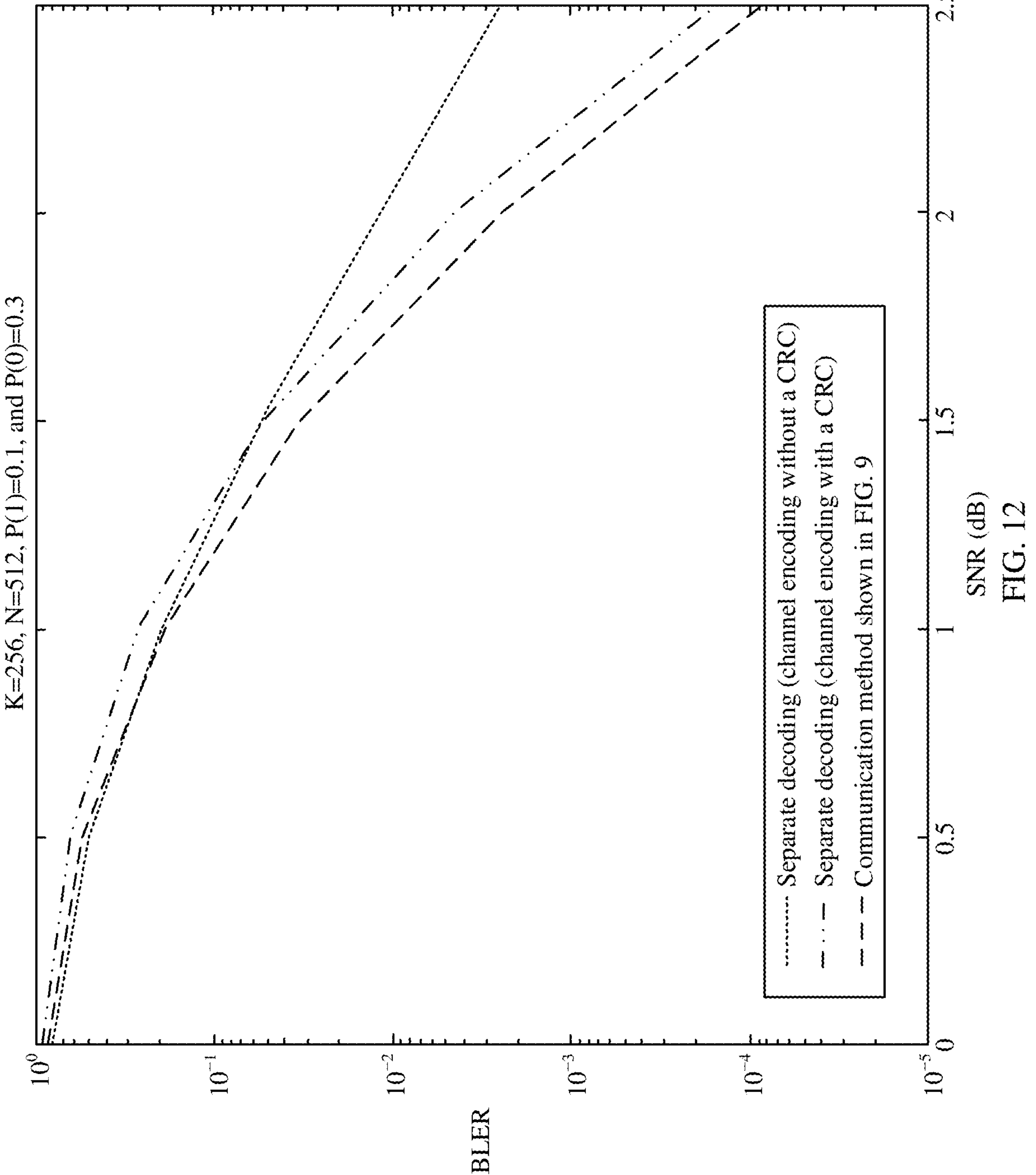
FIG. 12 is a schematic diagram of still another type of block error rate performance according to an embodiment of this application.

FIG. 10 to FIG. 12 are schematic diagrams of several types of block error rate performance according to embodiments of this application. FIG. 10 and FIG. 11 are schematic diagrams of block error rate (BLER) performance of the communication method shown in FIG. 5. FIG. 12 is a schematic diagram of block error rate performance of the communication method shown in FIG. 9.

FIG. 10 shows a comparison of block error rate performance between the communication method shown in FIG. 5 and two separate decoding schemes. With reference to FIG. 10, for example, a source length A is equal to 256, a length N of a fourth bit sequence is equal to 256, a source is a Bernoulli source whose P (0) is equal to 0.89, and a polar code decoding list size is 32. In the communication method shown in FIG. 5, channel encoding does not include a cyclic redundancy check (CRC) bit, and a check is performed by using an original source. As a comparison, two separate decoding schemes for arithmetic code and polar code are assessed. In one separate decoding scheme, no CRC bit is used for channel encoding, and in the other separate decoding scheme, an 8-bit channel CRC bit is used for channel encoding. It can be seen that in most signal-to-noise ratio (SNR) ranges, the communication method shown in FIG. 5 can bring a gain of about 0.1 dB to 0.2 dB.

Under a specific signal-to-noise ratio, a lower block error rate indicates that the method has higher transmission reliability under the signal-to-noise ratio. For a specific method, if a block error rate curve decreases faster (a slope is steeper) as a signal-to-noise ratio increases, it indicates that the method can achieve higher transmission reliability as the signal-to-noise ratio increases. It can be seen from FIG. 10 that, in most (SNR) ranges, decoding performance of the communication method shown in FIG. 5 is better.

FIG. 11 shows a comparison of block error rate performance between the communication method shown in FIG. 5 and two separate decoding schemes. With reference to FIG. 11, for example, a source length A is equal to 256, a length N of a fourth bit sequence is equal to 256, a source is a first-order Markov signal source with a transition probability matrix $$T = \begin{bmatrix} 0.9 & 0.1 \\ 0.3 & 0.7 \end{bmatrix},$$

and a polar code decoding list size is 32. In the communication method shown in FIG. 5, channel encoding does not include a cyclic redundancy check bit, and a check is performed by using an original source. As a comparison, two separate decoding schemes for arithmetic code and polar code are assessed. In one separate decoding scheme, no CRC bit is used for channel encoding, and in the other separate decoding scheme, an 8-bit channel CRC bit is used for channel encoding. It can be seen from FIG. 11 that, in most signal-to-noise ratio ranges, decoding performance of the communication method shown in FIG. 5 is better, and the communication method shown in FIG. 5 can bring a gain of about 0.1 dB to 0.2 dB.

FIG. 12 shows a comparison of block error rate performance between the communication method shown in FIG. 9 and two separate decoding schemes. With reference to FIG. 12, for example, a first length threshold K of a target length of source compression is equal to 256, a length N of a fourth bit sequence is equal to 512, a source is a first-order Markov signal source with a transition probability matrix $$T = \begin{bmatrix} 0.9 & 0.1 \\ 0.3 & 0.7 \end{bmatrix},$$

and a polar code decoding list size is 32. In the communication method shown in FIG. 9, channel encoding does not include a CRC bit, and a check is performed by using an original source. As a comparison, two separate decoding schemes for arithmetic code and polar code are assessed. In one separate decoding scheme, no CRC bit is used for channel encoding, and in the other separate decoding scheme, an 8-bit channel CRC bit is used for channel encoding. It can be seen from FIG. 12 that, in most signal-to-noise ratio ranges, decoding performance of the communication method shown in FIG. 9 is better, and the communication method shown in FIG. 9 can bring a gain of about 0.1 dB to 0.2 dB.

In addition to mapping some original source bits to corresponding locations that are of polar code and on which channel encoding is performed described in FIG. 5 to FIG. 12 to assist decoding, a design idea of this application may be further extended to another direction. For example, in a protocol procedure design, some fields may be mapped to some bit locations on which channel encoding is performed. The mapping herein may be mapping between some fields at a physical layer and some bit locations at the physical layer, or may be mapping between some fields at an upper layer and some bit locations at the physical layer. This is not limited in this application.

For example, this application may be applied to data mapping from a (MAC) layer to the physical layer. Operations such as cyclic redundancy check CRC encoding and segmentation may be performed on a transport block (TB) transmitted from the MAC layer to the physical layer, and channel encoding is performed. These operations are not limited in this application. The polar code may be used for channel encoding.

In this process, some fields in a MAC protocol data unit (PDU) may be mapped to information bit locations or frozen bit locations at the physical layer when encoding is performed by using the polar code.

For example, a reserved (R) field in a subheader in the MAC PDU is mapped to a corresponding information bit location that participates in a channel encoding. When decoding is performed on the corresponding location, a decoding result obtained by using a current decoding path based on the foregoing bit is inconsistent with an original mapping value of the R field. This indicates that an error occurs in the current decoding path, and the decoding path may be deleted.

For another example, a logical channel identity (LCID) field in a subheader in the MAC PDU is mapped to an information bit on which channel encoding is performed. When channel decoding is performed on the corresponding location, an obtained decoding result is converted into an LCID value. If the LCID value is exactly a reversed value of an LCID, a decoding error occurs, and a decoding path may be deleted.

For another example, in some scenarios, an LCID value is basically fixed. For example, in a random access scenario, Msg3 and Msg4 belong to a common control channel (CCCH), that is, LCID=0. The fixed LCID value may be mapped to an information bit on which channel encoding is performed. In this way, during channel decoding, whether a decoding error occurs in a current decoding path may be determined by comparing a decoding result of an actual mapping bit with an original mapping value, and whether the current decoding path needs to be deleted is determined.

It should be noted that the foregoing several mapping schemes are merely examples of idea expansion of this application. Actually, this application is not limited to the foregoing several mapping schemes. Similar mapping may be performed for another type of field, for example, a field added in a subsequent standard, and a method is similar. Details are not described in this application.

In general, in such a mapping method, when decoding is performed by using polar code, a value of a current decoding result and a value of an original mapping field can be cross-checked, so that an incorrect path can be deleted in advance, and decoding performance can be improved.

In this application, unless otherwise specified, for identical or similar parts in embodiments, refer to each other. In embodiments of this application and the implementations/implementation methods in embodiments, unless otherwise specified or a logical conflict occurs, terms and/or descriptions are consistent and may be mutually referenced between different embodiments and between the implementations/implementation methods in embodiments. Technical features in different embodiments and the implementations/implementation methods in embodiments may be combined to form a new embodiment, implementation, or implementation method based on an internal logical relationship thereof. The following implementations of this application are not intended to limit the protection scope of this application.

Figure 13:
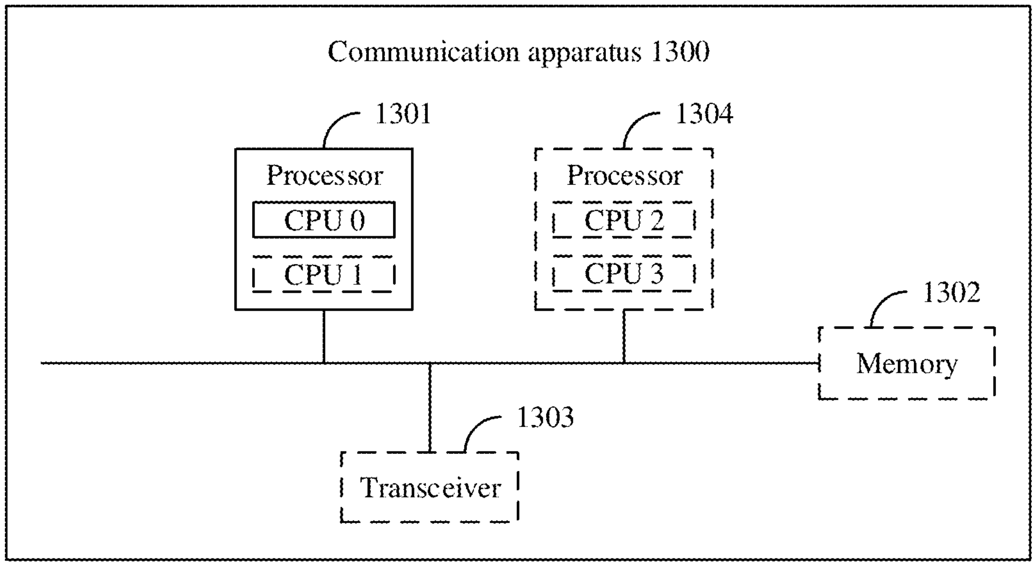
FIG. 13 is a schematic diagram of a structure of a communication apparatus according to an embodiment of this application.
Figure 14:
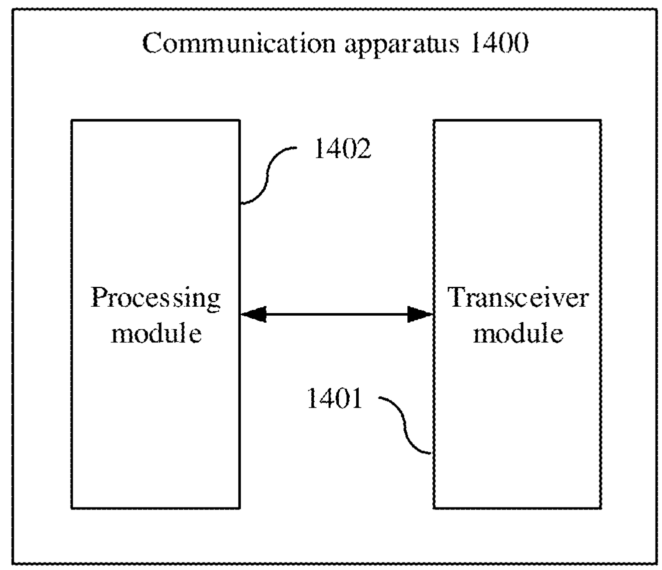
FIG. 14 is a schematic diagram of a structure of another communication apparatus according to an embodiment of this application.

With reference to FIG. 5 to FIG. 12, the foregoing describes in detail the communication method provided in embodiments of this application. With reference to FIG. 13 and FIG. 14, the following describes in detail communication apparatuses provided in embodiments of this application.

FIG. 13 is a schematic diagram of a structure of a communication apparatus that may be configured to perform the communication methods provided in embodiments of this application. The communication apparatus 1300 may be a receive end or a transmit end, a chip used in a receive end or a transmit end, or another component having a corresponding function. As shown in FIG. 13, the communication apparatus 1300 may include a processor 1301. In some embodiments, the communication apparatus 1300 may further include one or more of a memory 1302 and a transceiver 1303. The processor 1301 and the one or more of the memory 1302 and the transceiver 1303 may be coupled, for example, may be connected through a communication bus, or the processor 1301 may be used independently.

The following describes components of the communication apparatus 1300 with reference to FIG. 13.

The processor 1301 is a control center of the communication apparatus 1300, and may be one processor, or may be a collective term of a plurality of processing elements. For example, the processor 1301 is one or more central processing units (CPU), or may be an application-specific integrated circuit (ASIC), or is configured as one or more integrated circuits for implementing embodiments of this application, for example, one or more microprocessors (digital signal processor, DSP) or one or more field programmable gate arrays (FPGA).

The processor 1301 may perform various functions of the communication apparatus 1300 by running or executing a software program stored in the memory 1302 and invoking data stored in the memory 1302.

In a specific implementation, in an embodiment, the processor 1301 may include one or more CPUs, for example, a CPU 0 and a CPU 1 shown in FIG. 13.

In a specific implementation, in an embodiment, the communication apparatus 1300 may alternatively include a plurality of processors such as the processor 1301 and a processor 1304 shown in FIG. 13. Each of the processors may be a single-core processor (single-CPU) or a multi-core processor (multi-CPU). The processor herein may be one or more communication devices, circuits, and/or processing cores configured to process data (for example, computer program instructions).

In some embodiments, the memory 1302 may be a read-only memory (ROM) or another type of static storage communication device that may store static information and instructions, or a random access memory (RAM) or another type of dynamic storage communication device that may store information and instructions, or may be an electrically erasable programmable read-only memory (EEPROM), a compact disc read-only memory (CD-ROM), another optical disc storage medium, optical disc storage medium (including a compact disc, a laser disc, an optical disc, a digital versatile disc, a Blu-ray disc, or the like), or magnetic disc storage medium, another magnetic storage communication device, or any other medium that can carry or store expected program code in a form of instructions or a data structure and that can be accessed by a computer, but is not limited thereto. The memory 1302 may be integrated with the processor 1301; or may exist independently, and is coupled to the processor 1301 through an input/output port (not shown in FIG. 13) of the communication apparatus 1300. This is not limited in this embodiment of this application.

For example, the input port may be configured to implement the receiving function performed by the receive end or the transmit end in any one of the foregoing method embodiments, and the output port may be configured to implement the sending function performed by the receive end or the transmit end in any one of the foregoing method embodiments.

The memory 1302 may be configured to store a software program for executing the solutions of this application, and the processor 1301 controls execution. For a specific implementation, refer to the following apparatus embodiments. Details are not described herein again.

In some embodiments, the transceiver 1303 is configured to communicate with another communication apparatus. For example, when the communication apparatus 1300 is a receive end, the transceiver 1303 may be configured to communicate with a transmit end. For another example, when the communication apparatus 1300 is a transmit end, the transceiver 1303 may be configured to communicate with a receive end.

In addition, the transceiver 1303 may include a receive end and a transmit end (not separately shown in FIG. 13). The receive end is configured to implement a receiving function, and the transmit end is configured to implement a sending function. The transceiver 1303 may be integrated with the processor 1301; or may exist independently, and is coupled to the processor 1301 through the input/output port (not shown in FIG. 13) of the communication apparatus 1300. This is not limited in this embodiment of this application.

It should be noted that, the structure of the communication apparatus 1300 shown in FIG. 13 does not constitute a limitation on the communication apparatus. An actual communication apparatus may include more or fewer components than those shown in the figure, combine some components, or have different component arrangement.

The processor 1301 of the communication apparatus 1300 shown in FIG. 13 may invoke application program code stored in the memory 1302 to indicate the transmit end to execute the foregoing actions of the transmit end in FIG. 5 to FIG. 12.

The processor 1301 of the communication apparatus 1300 shown in FIG. 13 may invoke the application program code stored in the memory 1302 to indicate the receive end to execute the foregoing actions of the receive end in FIG. 5 to FIG. 12. This is not limited in this embodiment.

When the communication apparatus is the transmit end, the communication apparatus 1300 may perform any one or more possible design manners related to the transmit end in the foregoing method embodiments. When the communication apparatus is the receive end, the communication apparatus 1300 may perform any one or more possible design manners related to the receive end in the foregoing method embodiments.

It should be noted that, all related content of steps in the foregoing method embodiments may be cited in function descriptions of corresponding functional modules. Details are not described herein again.

FIG. 14 is a schematic diagram of a structure of another communication apparatus according to an embodiment of this application. For ease of description, FIG. 14 shows only main components of the communication apparatus.

The communication apparatus 1400 may include a transceiver module 1401 and a processing module 1402. The communication apparatus 1400 may be the transmit end or the receive end in the foregoing method embodiments. The transceiver module 1401 may also be referred to as a transceiver unit, and is configured to implement the transceiver function performed by the transmit end or the receive end in any one of the foregoing method embodiments.

It should be noted that the transceiver module 1401 may include a receiving module and a sending module (not shown in FIG. 14). The receiving module is configured to receive data and/or signaling from another device, and the sending module is configured to send data and/or signaling to the another device. A specific implementation of the transceiver module is not limited in this application. The transceiver module may include a transceiver circuit, a transceiver machine, a transceiver, or a communication interface.

The processing module 1402 may be configured to implement the processing function performed by the transmit end or the receive end in any one of the foregoing method embodiments. The processing module 1402 may be a processor.

In this embodiment, the communication apparatus 1400 is presented in a form of functional modules obtained through division in an integrated manner. The "module" herein may be an ASIC, a circuit, a processor that executes one or more software or firmware programs, a memory, an integrated logic circuit, and/or another component that can provide the foregoing functions. In a simple embodiment, a person skilled in the art may figure out that the communication apparatus 1400 may be in a form of the communication apparatus 1300 shown in FIG. 13.

For example, the processor 1301 of the communication apparatus 1300 shown in FIG. 13 may invoke computer-executable instructions stored in the memory 1302, so that the communication method in the foregoing method embodiments is performed.

Functions/implementation processes of the transceiver module 1401 and the processing module 1402 in FIG. 14 may be implemented by the processor 1301 of the communication apparatus 1300 shown in FIG. 13 by invoking computer-executable instructions stored in the memory 1302. Alternatively, functions/implementation processes of the processing module 1402 in FIG. 14 may be implemented by the processor 1301 of the communication apparatus 1300 shown in FIG. 13 by invoking the computer-executable instructions stored in the memory 1302, and functions/implementation processes of the transceiver module 1401 in FIG. 14 may be implemented by the transceiver 1303 of the communication apparatus 1300 shown in FIG. 13.

Because the communication apparatus 1400 provided in this embodiment may perform the foregoing communication method, for technical effect that can be achieved by the communication apparatus 1400, refer to the foregoing method embodiments. Details are not described herein again.

In some embodiments solution, the communication apparatus 1400 shown in FIG. 14 may be used in the communication system shown in FIG. 1, and perform the function of the transmit end in the communication method shown in FIG. 5 or FIG. 9.

The processing module 1402 is configured to perform source encoding on a first bit sequence to obtain a second bit sequence. A length of the first bit sequence is A, A is an integer greater than 0, a length of the second bit sequence is B, and B is an integer greater than 0.

The processing module 1402 is further configured to obtain a fourth bit sequence based on the second bit sequence and a third bit sequence. The third bit sequence is C bits in the first bit sequence, C is an integer greater than 0 and less than or equal to A, a length of the fourth bit sequence is N, N is an integer greater than 0, the fourth bit sequence includes one or more information bits and one or more frozen bits, the second bit sequence is located on B information bit locations in the fourth bit sequence, the third bit sequence is located on a first bit location in the fourth bit sequence, the first bit location includes E information bit locations and F frozen bit locations, E+F=C, E is an integer greater than or equal to 0, and F is an integer greater than or equal to 0.

The processing module 1402 is further configured to perform channel encoding on the fourth bit sequence to obtain a fifth bit sequence. A length of the fifth bit sequence is N, and N is an integer greater than 0.

The transceiver module 1401 is configured to send the fifth bit sequence.

In some embodiments, the communication apparatus 1400 may further include a storage module (not shown in FIG. 14). The storage module stores a program or instructions. When the processing module 1402 executes the program or the instructions, the communication apparatus 1400 may perform the function of the transmit end in the communication method shown in FIG. 5 or FIG. 9.

It should be noted that the communication apparatus 1400 may be the transmit end, or may be a chip (system) or another component or assembly disposed in the transmit end. This is not limited in this application.

In addition, for technical effect of the communication apparatus 1400, refer to technical effect of the communication method shown in FIG. 5 or FIG. 9. Details are not described herein again.

In another possible design solution, the communication apparatus 1400 shown in FIG. 14 may be used in the communication system shown in FIG. 1, and perform the function of the receive end in the communication method shown in FIG. 5.

The transceiver module 1401 is configured to receive a to-be-decoded sequence. A length of the to-be-decoded sequence is N, N is an integer greater than 0, the to-be-decoded sequence is a sequence obtained after a fifth bit sequence is transmitted through a channel, the fifth bit sequence is a channel encoding value of a fourth bit sequence, a first location in the to-be-decoded sequence corresponds to a first bit location in the fourth bit sequence, a third bit sequence is located on the first bit location in the fourth bit sequence, the first bit location in the fourth bit sequence includes E information bit locations and F frozen bit locations, E+F=C, E is an integer greater than or equal to 0, F is an integer greater than or equal to 0, the third bit sequence is C bits in a first bit sequence, a length of the first bit sequence is A, A is an integer greater than 0, and C is an integer greater than 0 and less than or equal to A. A second location in the to-be-decoded sequence corresponds to B information bit locations occupied by a second bit sequence in the fourth bit sequence, the second bit sequence is a source encoding value of the first bit sequence, a length of the second bit sequence is B, and B is an integer greater than 0. A channel decoding value of the fourth bit sequence includes a channel decoding value of the second bit sequence and a channel decoding value of the third bit sequence, and a length of the fourth bit sequence is N.

The processing module 1402 is configured to perform channel decoding on the to-be-decoded sequence to obtain the channel decoding value of the fourth bit sequence. The channel decoding value of the fourth bit sequence includes the channel decoding value of the second bit sequence and the channel decoding value of the third bit sequence, and the length of the fourth bit sequence is N.

The processing module 1402 is further configured to perform source decoding on the channel decoding value of the second bit sequence to obtain a source decoding value of the first bit sequence.

It should be noted that, all related content of steps in the foregoing method embodiments may be cited in function descriptions of corresponding functional modules. Details are not described herein again.

In some embodiments, the communication apparatus 1400 may further include a storage module (not shown in FIG. 14). The storage module stores a program or instructions. When the processing module 1402 executes the program or the instructions, the communication apparatus 1400 may perform the function of the receive end in the communication method shown in FIG. 5.

It should be noted that the communication apparatus 1400 may be the receive end, or may be a chip (system) or another component or assembly disposed in the receive end. This is not limited in this application.

In addition, for technical effect of the communication apparatus 1400, refer to technical effect of the communication method shown in FIG. 5. Details are not described herein again.

In still another possible design solution, the communication apparatus 1400 shown in FIG. 14 may be used in the communication system shown in FIG. 1, and perform the function of the receive end in the communication method shown in FIG. 9.

The transceiver module 1401 is configured to receive a to-be-decoded sequence. The to-be-decoded sequence is a sequence obtained after a fifth bit sequence is transmitted through a channel, the fifth bit sequence is a channel encoding value of a fourth bit sequence, a first location in the to-be-decoded sequence corresponds to a first bit location in the fourth bit sequence, a third bit sequence is located on the first bit location in the fourth bit sequence, the first bit location in the fourth bit sequence includes C information bit locations, the third bit sequence is C bits in a first bit sequence, a length of the first bit sequence is A, A is an integer greater than 0, and C is an integer greater than 0 and less than or equal to A. A second location in the to-be-decoded sequence corresponds to B information bit locations occupied by a second bit sequence in the fourth bit sequence, the second bit sequence is a source encoding value of the first bit sequence, a length of the second bit sequence is B, and B is an integer greater than 0.

The processing module 1402 is configured to perform iterative channel decoding for a $q^{th}$ time on the to-be-decoded sequence to obtain a channel decoding value of the fourth bit sequence. q is an integer greater than 0, and the channel decoding value of the fourth bit sequence includes a channel decoding value of the second bit sequence and a channel decoding value of the third bit sequence.

The processing module 1402 is further configured to perform source decoding for a $g^{th}$ time on the channel decoding value of the second bit sequence to obtain a source decoding value of the first bit sequence. g is an integer greater than 0, and the source decoding value of the first bit sequence includes a source decoding value of the third bit sequence.

The processing module 1402 is further configured to: when the channel decoding value of the third bit sequence is the same as the source decoding value of the third bit sequence, or q is equal to Q, output the source decoding value of the first bit sequence. Q is a maximum quantity of iterations, and Q is an integer greater than 0.

It should be noted that, all related content of steps in the foregoing method embodiments may be cited in function descriptions of corresponding functional modules. Details are not described herein again.

In some embodiments, the communication apparatus 1400 may further include a storage module (not shown in FIG. 14). The storage module stores a program or instructions. When the processing module 1402 executes the program or the instructions, the communication apparatus 1400 may perform the function of the receive end in the communication method shown in FIG. 9.

It should be noted that the communication apparatus 1400 may be the receive end, or may be a chip (system) or another component or assembly disposed in the receive end. This is not limited in this application.

In addition, for technical effect of the communication apparatus 1400, refer to technical effect of the communication method shown in FIG. 9. Details are not described herein again.

An embodiment of this application provides a communication system. The communication system includes a transmit end and a receive end.

The transmit end is configured to perform actions of the transmit end in the foregoing method embodiments. For a specific execution method and process, refer to the foregoing method embodiments. Details are not described herein again.

The receive end is configured to perform actions of the receive end in the foregoing method embodiments. For a specific execution method and process, refer to the foregoing method embodiments. Details are not described herein again.

An embodiment of this application provides a chip system. The chip system includes a logic circuit and an input/output port. The logic circuit may be configured to implement a processing function related to the communication method provided in embodiments of this application, and the input/output port may be configured for sending and receiving functions related to the communication method provided in embodiments of this application.

For example, the input port may be configured to implement a receiving function related to the communication method provided in embodiments of this application, and the output port may be configured to implement a sending function related to the communication method provided in embodiments of this application.

For example, the processor of the communication apparatus 1300 may be configured to perform, for example, but not limited to, baseband-related processing, and the transceiver of the communication apparatus 1300 may be configured to perform, for example, but not limited to, radio frequency receiving and sending. The foregoing components may be separately disposed on chips that are independent of each other, or at least some or all of the components may be disposed on a same chip. For example, the processor may be further divided into an analog baseband processor and a digital baseband processor. The analog baseband processor and the transceiver may be integrated on a same chip, and the digital baseband processor may be disposed on an independent chip. With continuous development of integrated circuit technologies, increasingly more components may be integrated on a same chip. For example, the digital baseband processor may be integrated on a same chip with a plurality of application processors (for example, but not limited to a graphics processing unit and a multimedia processor). The chip may be referred to as a system-on-a-chip. Whether components are independently disposed on different chips or are integrated and disposed on one or more chips usually depends on specific requirements of a product design. Specific implementation forms of the components are not limited in embodiments of this application.

In some embodiments, the chip system further includes a memory. The memory is configured to store program instructions and data for implementing functions related to the communication method provided in embodiments of this application.

The chip system may include a chip, or may include a chip and another discrete component.

An embodiment of this application provides a computer-readable storage medium. The computer-readable storage medium stores a computer program or instructions. When the computer program or the instructions are run on a computer, the communication method provided in embodiments of this application is enabled to be performed.

An embodiment of this application provides a computer program product. The computer program product includes a computer program or instructions. When the computer program or the instructions are run on a computer, the communication method provided in embodiments of this application is enabled to be performed.

It should be understood that in embodiments of this application, the processor may be a CPU. The processor may alternatively be a general-purpose processor, a DSP, an ASIC, a FPGA or another programmable logic device, a discrete gate or a transistor logic device, a discrete hardware component, or the like. The general-purpose processor may be a microprocessor, or the processor may be any processor or the like.

It may be understood that the memory in embodiments of this application may be a volatile memory or a non-volatile memory, or may include a volatile memory and a non-volatile memory. The non-volatile memory may be a ROM, a programmable read-only memory (PROM), an erasable programmable read-only memory (EPROM), an EEPROM, or a flash memory. The volatile memory may be a RAM that is used as an external cache. By way of example but not limitation, RAM in a plurality of forms may be used, for example, a static random access memory (SRAM), a dynamic random access memory (DRAM), a synchronous dynamic random access memory (SDRAM), a double data rate synchronous dynamic random access memory (DDR SDRAM), an enhanced synchronous dynamic random access memory (ESDRAM), a synchlink dynamic random access memory (SLDRAM), and a direct rambus random access memory (DR RAM).

All or some of the foregoing embodiments may be implemented using software, hardware (for example, circuit), firmware, or any combination thereof. When software is used to implement embodiments, the foregoing embodiments may be implemented completely or partially in a form of a computer program product. The computer program product includes one or more computer instructions or computer programs. When the program instructions or the computer programs are loaded and executed on the computer, the procedures or functions according to embodiments of this application are all or partially generated. The computer may be a general-purpose computer, a special-purpose computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, infrared, radio, and microwave, or the like) manner. The computer-readable storage medium may be any usable medium accessible by a computer, or a data storage device, for example, a server or a data center, integrating one or more usable media. The usable medium may be a magnetic medium (for example, a floppy disk, a hard disk, or a magnetic tape), an optical medium (for example, a DVD), or a semiconductor medium. The semiconductor medium may be a solid state disk.

It should be understood that the term "and/or" in this specification describes only an association relationship between associated objects, and indicates that three relationships may exist. For example, A and/or B may indicate the following three cases: Only A exists, both A and B exist, and only B exists, where A and B may be singular or plural. In addition, the character "/" in this specification usually indicates an "or" relationship between associated objects, or may indicate an "and/or" relationship. A specific meaning depends on the context.

In this application, "at least one" means one or more, and "a plurality of" means two or more. "At least one of the following items (pieces)" or a similar expression thereof refers to any combination of these items, including a single item (piece) or any combination of a plurality of items (pieces). For example, at least one item (piece) of a, b, or c may represent a, b, c, a and b, a and c, b and c, or a, b, and c, where a, b, and c each may be singular or plural.

It should be understood that sequence numbers of the foregoing processes do not mean execution sequences in various embodiments of this application. The execution sequences of the processes should be determined based on functions and internal logic of the processes, and should not be construed as any limitation on the implementation processes of embodiments of this application.

A person of ordinary skill in the art may be aware that, in combination with the examples described in embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments. Details are not described herein again.

In the several embodiments provided in this application, it should be understood that the disclosed systems, apparatuses, and methods may be implemented in other manners. For example, the described apparatus embodiments are merely examples. For example, division into units is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on an actual requirement to achieve the objectives of the solutions of embodiments.

In addition, functional units in embodiments of this application may be integrated into one processing unit, or each of the units may exist alone physically, or two or more units may be integrated into one unit.

When the functions are implemented in a form of a software functional unit and sold or used as an independent product, the functions may be stored in a computer-readable storage medium. Based on such an understanding, the technical solutions of this application essentially, or the part contributing to the technology of some approaches, or some of the technical solutions may be implemented in a form of a software product. The computer software product is stored in a storage medium, and includes several instructions for instructing a computer device (which may be a personal computer, a server, or a network device) to perform all or some of the steps of the methods described in embodiments of this application. The foregoing storage medium includes any medium, for example, a USB flash drive, a removable hard disk, a ROM, a RAM, a magnetic disk, an optical disc, or the like that can store program code.

The foregoing description is merely a specific implementation of this application, but is not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A communication method, comprising:

performing source encoding on a first bit sequence thereby obtaining a second bit sequence, wherein a length of the first bit sequence is A, where A is an integer greater than 0, a length of the second bit sequence is B, and B is an integer greater than 0;

obtaining a fourth bit sequence based on the second bit sequence and a third bit sequence, wherein the third bit sequence is C bits in the first bit sequence, where C is an integer greater than 0, and C is less than or equal to A, a length of the fourth bit sequence is N, where N is an integer greater than 0, the fourth bit sequence comprises:

one or more information bits; and one or more frozen bits, wherein the second bit sequence is located in B information bit locations in the fourth bit sequence, the third bit sequence is located in a first bit location in the fourth bit sequence, the first bit location comprises:

E information bit locations and F frozen bit locations, C=E+F, E is an integer greater than or equal to 0, and F is an integer greater than or equal to 0;

performing channel encoding on the fourth bit sequence thereby obtaining a fifth bit sequence, wherein a length of the fifth bit sequence is N, where N is an integer greater than 0; and sending the fifth bit sequence.

2. The communication method according to claim 1, wherein

E is equal to C,

F is equal to 0, and the first bit location satisfies a first condition, and the first condition comprises:

the first bit location being located in the E information bit locations whose natural orders rank top in the fourth bit sequence.

3. The communication method according to claim 1, wherein

F is equal to C,

E is equal to 0, and the first bit location satisfies a second condition, and the second condition comprises:

the first bit location in the fourth bit sequence corresponds to a first location in a to-be-decoded sequence, wherein after source decoding is performed on a result obtained by performing channel decoding on a value before the first location in the to-be-decoded sequence, obtaining source decoding values of one or more bits in the third bit sequence; or the first bit location is located on the F frozen bit locations whose natural orders rank low in the fourth bit sequence.

4. The communication method according to claim 1, wherein the third bit sequence is C bits in the first bit sequence comprises:

the third bit sequence being C bits whose natural orders rank top in the first bit sequence.

5. The communication method according to claim 1, wherein the third bit sequence is located in the first bit location in the fourth bit sequence comprises:

a scrambled third bit sequence is located in the first bit location in the fourth bit sequence; and obtaining the scrambled third bit sequence based on a scrambling sequence and the third bit sequence.

6. A communication method, comprising:

receiving a to-be-decoded sequence, wherein a length of the to-be-decoded sequence is N, where N is an integer greater than 0, the to-be-decoded sequence is obtained after a fifth bit sequence is transmitted through a channel, the fifth bit sequence is a channel encoding value of a fourth bit sequence, a first location in the to-be-decoded sequence corresponds to a first bit location in the fourth bit sequence, a third bit sequence is located in the first bit location in the fourth bit sequence, the first bit location in the fourth bit sequence comprises;

E information bit locations, and

F frozen bit locations, C=E+F, wherein E is an integer greater than or equal to 0, F is an integer greater than or equal to 0, the third bit sequence is C bits in a first bit sequence, a length of the first bit sequence is A, A is an integer greater than 0, C is an integer greater than 0, and C is less than or equal to A, a second location in the to-be-decoded sequence corresponds to B information bit locations occupied by a second bit sequence in the fourth bit sequence, the second bit sequence is a source encoding value of the first bit sequence, a length of the second bit sequence is B, and B is an integer greater than 0;

performing channel decoding on the to-be-decoded sequence thereby obtaining a channel decoding value of the fourth bit sequence, wherein the channel decoding value of the fourth bit sequence comprises:

a channel decoding value of the second bit sequence, and a channel decoding value of the third bit sequence, and a length of the fourth bit sequence is N; and performing source decoding on the channel decoding value of the second bit sequence thereby obtaining a source decoding value of the first bit sequence.

7. The communication method according to claim 6, wherein

E is equal to C,

F is equal to 0, and the first bit location in the fourth bit sequence satisfies a first condition, and the first condition comprises:

the first bit location being located in the E information bit locations whose natural orders rank top in the fourth bit sequence.

8. The communication method according to claim 7, wherein the performing channel decoding on the to-be-decoded sequence thereby obtaining the channel decoding value of the fourth bit sequence comprises:

a channel decoding mode is a successive cancellation list (SCL) decoding mode, a quantity of lists is L, where L is an integer greater than 0, an initial value of an integer $c_{u\_total}$ is equal to 0, and in response to $c_{u\_total}$ being less than C, a first source channel operation is performed comprising:

performing channel decoding on values of an $(n-m)^{th}$ bit to an $n^{th}$ bit in the to-be-decoded sequence thereby obtaining a first decoding result, wherein the $(n-m)^{th}$ bit to the $n^{th}$ bit comprise at least one of at least one location in the first location or b locations in the second location, where n−m is an integer greater than 0, m is an integer greater than 0, the first decoding result comprises at least one of channel decoding values of b bits in the second bit sequence or a channel decoding value of at least one bit in the third bit sequence, and b is an integer greater than 0 and less than or equal to B;

performing source decoding on the channel decoding values corresponding to the b bits in the second bit sequence thereby obtaining source decoding values of $c_t$ bits in the third bit sequence, where $c_t$ is an integer greater than 0 and less than or equal to C; and at least one of:

determining, based on source decoding values of $c_u$ bits in the third bit sequence and channel decoding values of $c_u$ bits corresponding to a natural order of the third bit sequence, to continue to perform, based on l decoding paths, the first source channel operation on values of an $(n+1)^{th}$ bit to an $N^{th}$ bit in the to-be-decoded sequence, and counting $c_u$ in $c_{u\_total}$, where $c_u$ is an integer greater than 0, and l is an integer less than or equal to L; or continuing to perform channel decoding on the values of the $(n+1)^{th}$ bit to the $N^{th}$ bit in the to-be-decoded sequence in response $c_{u\_total}$ being equal to C and n being less than N.

9. The communication method according to claim 8, wherein the determining, based on the source decoding values of the $c_u$ bits in the third bit sequence and the channel decoding values of the $c_u$ bits corresponding to the natural order of the third bit sequence, to continue to perform, based on the l decoding paths, the first source channel operation on the values of the $(n+1)^{th}$ bit to the $N^{th}$ bit in the to-be-decoded sequence, and counting the $c_u$ in the $c_{u\_total}$ comprises:

traversing the l decoding paths, determining whether the source decoding values that correspond to a first decoding path and that are of the $c_u$ bits in the third bit sequence are the same as the channel decoding values that correspond to the first decoding path and that are of the $c_u$ bits corresponding to the natural order of the third bit sequence, and counting the $c_u$ in the $c_{u\_total}$, wherein the first decoding path is one of the l decoding paths; and at least one of:

determining to delete the first decoding path, and terminating the first source channel operation that is based on the first decoding path in response to the source decoded values that correspond to a first decoding path and that are of the $c_u$ bits in the third bit sequence being different from the channel decoded values, corresponding to the first decoding path, that correspond to the natural order of the third bit sequence and that are of the $c_u$ bits are different; or determining that the l decoding paths comprise the first decoding path in response to the source decoded values that correspond to the first decoding path and that are of the $c_u$ bits in the third bit sequence being different from the channel decoded values, corresponding to the first decoding path, that correspond to the natural order of the third bit sequence and that are of the $c_u$ bits are the same.

10. The communication method according to claim 6, wherein

F is equal to C,

E is equal to 0, and the first bit location satisfies a second condition, and the second condition comprises:

the first bit location in the fourth bit sequence corresponds to a first location in a to-be-decoded sequence, wherein after source decoding is performed on a result obtained by performing channel decoding on a value before the first location in the to-be-decoded sequence, obtaining source decoding values of one or more bits in the third bit sequence; or the first bit location is located on the F frozen bit locations whose natural orders rank low in the fourth bit sequence.

11. The communication method according to claim 10, wherein the performing channel decoding on the to-be-decoded sequence thereby obtaining the channel decoding value of the fourth bit sequence comprises:

a channel decoding mode is a successive cancellation list (SCL) decoding mode, a quantity of lists is L, where L is an integer greater than 0, an initial value of an integer $c_{t\_total}$ is equal to 0, and in response to $c_{t\_total}$ being less than C, a second source channel operation is performed comprising:

performing channel decoding on values of an $(n-m)^{th}$ bit to an $n^{th}$ bit in the to-be-decoded sequence thereby obtaining a second decoding result, wherein an $(n+1)^{th}$ bit is one location in the first location, n−m is an integer greater than 0, m is an integer greater than 0, and the second decoding result comprises channel decoding values of b bits in the second bit sequence;

performing source decoding on the channel decoding values of the b bits in the second bit sequence thereby obtaining source decoding values of $c_t$ bits in the third bit sequence, and counting $c_t$ in $c_{t\_total}$, wherein $c_t$ is an integer greater than 0, and is less than or equal to C, and the source decoding values of the $c_t$ bits in the third bit sequence are successively used as channel decoding values at $c_t$ locations in the first location in the to-be-decoded sequence; and at least one of:

continuing to perform the second source channel operation on values of the $(n+1)^{th}$ bit to an $N^{th}$ bit in the to-be-decoded sequence in response to $c_t$ total being greater than 0 and less than C; or continuing to perform channel decoding on values of the $(n+1)^{th}$ bit to an $N^{th}$ bit in the to-be-decoded sequence in response to $c_{t\_total}$ being equal to C and n being less than N.

12. The communication method according to claim 6, wherein the third bit sequence is C bits in a first bit sequence comprises:

the third bit sequence being C bits whose natural orders rank top in the first bit sequence.

13. A communication method, comprising:

receiving a to-be-decoded sequence, wherein the to-be-decoded sequence is obtained after a fifth bit sequence is transmitted through a channel, the fifth bit sequence is a channel encoding value of a fourth bit sequence, a first location in the to-be-decoded sequence corresponds to a first bit location in the fourth bit sequence, a third bit sequence is located in the first bit location in the fourth bit sequence, the first bit location in the fourth bit sequence comprises C information bit locations, the third bit sequence is C bits in a first bit sequence, a length of the first bit sequence is A, where A is an integer greater than 0, C is an integer greater than 0, and C is less than or equal to A, a second location in the to-be-decoded sequence corresponds to B information bit locations occupied by a second bit sequence in the fourth bit sequence, the second bit sequence is a source encoding value of the first bit sequence, a length of the second bit sequence is B, and B is an integer greater than 0;

performing iterative channel decoding for a $q^{th}$ time on the to-be-decoded sequence thereby obtaining a channel decoding value of the fourth bit sequence, where q is an integer greater than 0, and the channel decoding value of the fourth bit sequence comprises:

a channel decoding value of the second bit sequence, and a channel decoding value of the third bit sequence;

performing source decoding for a $g^{th}$ time on the channel decoding value of the second bit sequence thereby obtaining a source decoding value of the first bit sequence, where g is an integer greater than 0, and the source decoding value of the first bit sequence comprises a source decoding value of the third bit sequence; and outputting the source decoding value of the first bit sequence in response to the channel decoding value of the third bit sequence being the same as the source decoding value of the third bit sequence, or q being equal to Q, where Q is a maximum quantity of iterations, and Q is an integer greater than 0, and q is an integer.

14. The communication method according to claim 13, wherein the method further comprises:

performing iterative channel decoding for a $(q+s)^{th}$ time on the to-be-decoded sequence, and performing source decoding for a $(g+t)^{th}$ time on the channel decoding value that is in a result obtained by performing iterative channel decoding for a $(q+s)^{th}$ time and that is of the second bit sequence in response to the channel decoding value of the third bit sequence being different from the source decoding value of the third bit sequence, and q is less than Q, where s is an integer greater than 0, and t is an integer greater than 0.

15. The communication method according to claim 13, wherein the performing source decoding for the $g^{th}$ time on the channel decoding value of the second bit sequence thereby obtaining the source decoding value of the first bit sequence comprises:

performing source decoding for a $g^{th}$ time on the channel decoding value of the second bit sequence to obtain the source decoding value of the first bit sequence in response to the channel decoding value of the fourth bit sequence passing a channel check.

* * * * *